(12) United States Patent
Nakamura et al.

(10) Patent No.: US 10,393,830 B2
(45) Date of Patent: Aug. 27, 2019

(54) MAGNETIC RESONANCE IMAGING APPARATUS

(71) Applicant: Toshiba Medical Systems Corporation, Otawara-shi (JP)

(72) Inventors: Haruki Nakamura, Nasushiobara (JP); Yuji Takano, Tokyo (JP)

(73) Assignee: Canon Medical Systems Corporation, Otawara-shi (JP)

( * ) Notice: Subject to any disclaimer, the term of this patent is extended or adjusted under 35 U.S.C. 154(b) by 142 days.

(21) Appl. No.: 15/448,240

(22) Filed: Mar. 2, 2017

(65) Prior Publication Data

US 2017/0261573 A1    Sep. 14, 2017

(30) Foreign Application Priority Data

Mar. 10, 2016    (JP) .................................. 2016-047476

(51) Int. Cl.
*G01V 3/00*    (2006.01)
*G01R 33/36*    (2006.01)
*G01R 33/54*    (2006.01)
*G01R 33/58*    (2006.01)

(52) U.S. Cl.
CPC ....... *G01R 33/3614* (2013.01); *G01R 33/543* (2013.01); *G01R 33/583* (2013.01)

(58) Field of Classification Search
CPC ............ G01R 33/5659; G01R 33/3614; G01R 33/288; G01R 33/34023; G01R 33/3453; G01R 33/3415; G01R 33/3621; G01R 33/33; G01R 33/3635; G01R 33/365
USPC .......................................................... 324/322
See application file for complete search history.

(56) References Cited

U.S. PATENT DOCUMENTS

| | | | |
|---|---|---|---|
| 6,879,852 B1 * | 4/2005 | Mueller ............. | G01R 33/3614 600/407 |
| 8,179,133 B1 * | 5/2012 | Kornev ............. | G01R 33/0354 324/225 |
| 8,827,889 B2 * | 9/2014 | Smith .................. | A61M 1/127 600/16 |
| 2003/0025501 A1 * | 2/2003 | Ideler ................. | G01R 33/3873 324/318 |
| 2009/0167307 A1 | 7/2009 | Kopp | |
| 2012/0032678 A1 * | 2/2012 | Vaughan, Jr. ...... | G01R 33/3415 324/318 |
| 2012/0112748 A1 * | 5/2012 | Hetherington ... | G01R 33/34007 324/318 |

(Continued)

FOREIGN PATENT DOCUMENTS

| | | |
|---|---|---|
| JP | 11-318854 | 11/1999 |
| JP | 2014-516631 | 7/2014 |
| JP | 5602160 | 10/2014 |

*Primary Examiner* — Rodney E Fuller
(74) *Attorney, Agent, or Firm* — Oblon, McClelland, Maier & Neustadt, L.L.P.

(57) ABSTRACT

According to one embodiment, a magnetic resonance imaging apparatus includes an amplifier, a capacitor bank, and processing circuitry. The amplifier supplies, based on an imaging sequence, an RF pulse to an RF coil which generates a radio frequency magnetic field. The capacitor bank supplies an electric power to the amplifier. The processing circuitry judges whether an imaging by the imaging sequence is able to be executed, based on a condition of the RF pulse in the imaging sequence and an output efficiency of the amplifier.

10 Claims, 15 Drawing Sheets

(56) References Cited

U.S. PATENT DOCUMENTS

| | | | |
|---|---|---|---|
| 2014/0009151 A1* | 1/2014 | Van Helvoort | G01R 33/3856 |
| | | | 324/307 |
| 2014/0058248 A1 | 2/2014 | Leussler | |
| 2014/0364727 A1* | 12/2014 | Piao | A61B 5/0093 |
| | | | 600/431 |
| 2016/0033609 A1* | 2/2016 | Yamanaka | G01R 33/5659 |
| | | | 324/322 |
| 2016/0116557 A1* | 4/2016 | Feiweier | G01R 33/543 |
| | | | 324/322 |
| 2017/0011255 A1* | 1/2017 | Kaditz | G01R 33/48 |
| 2017/0363698 A1* | 12/2017 | Lin | G01R 33/3852 |

* cited by examiner

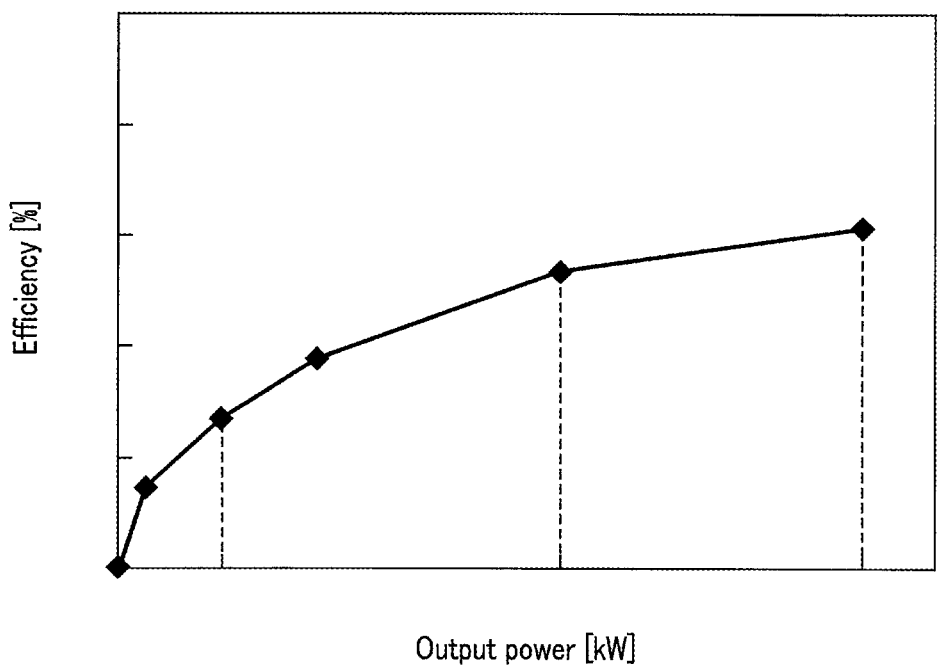
F I G. 4

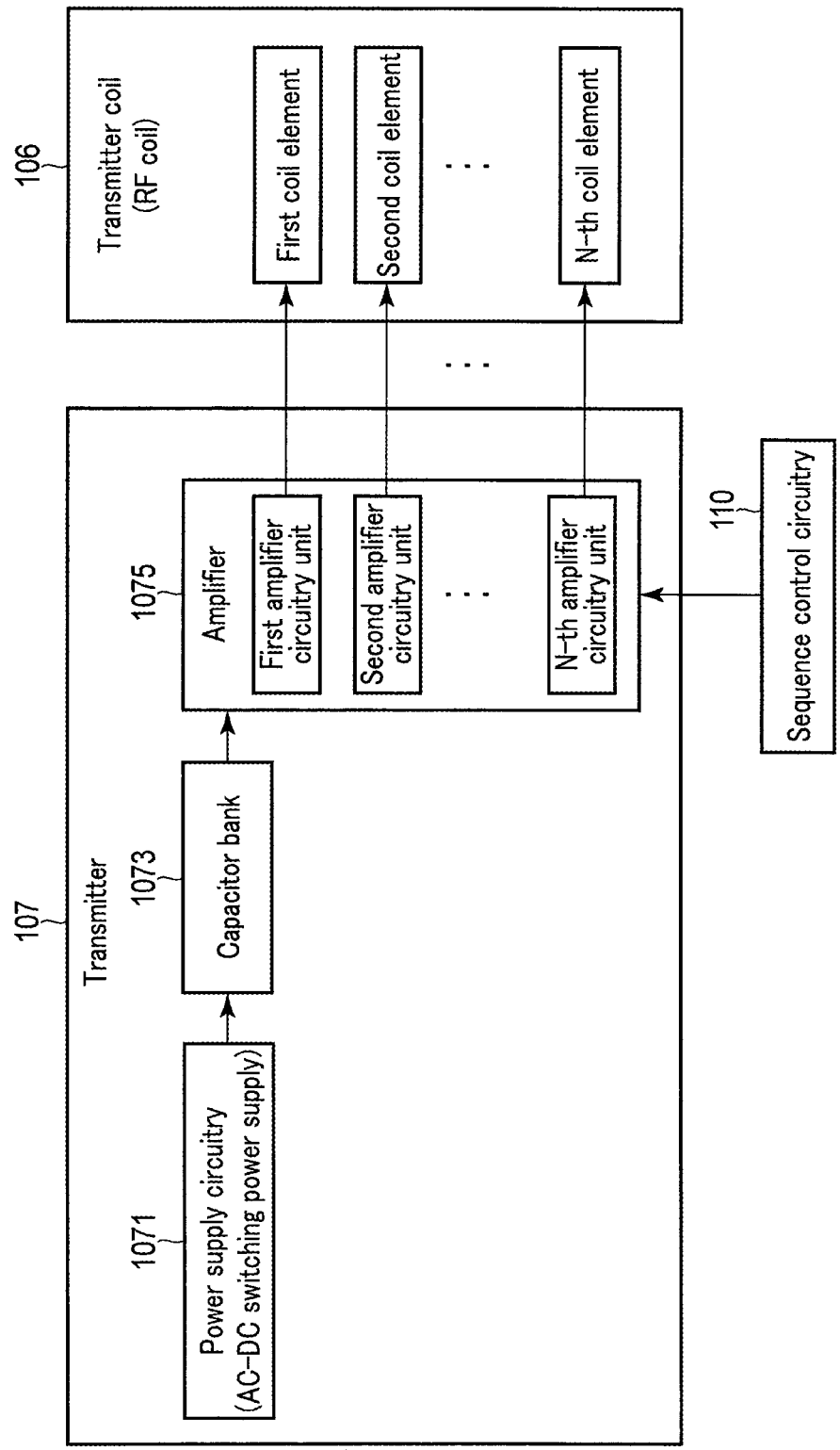
F I G. 8

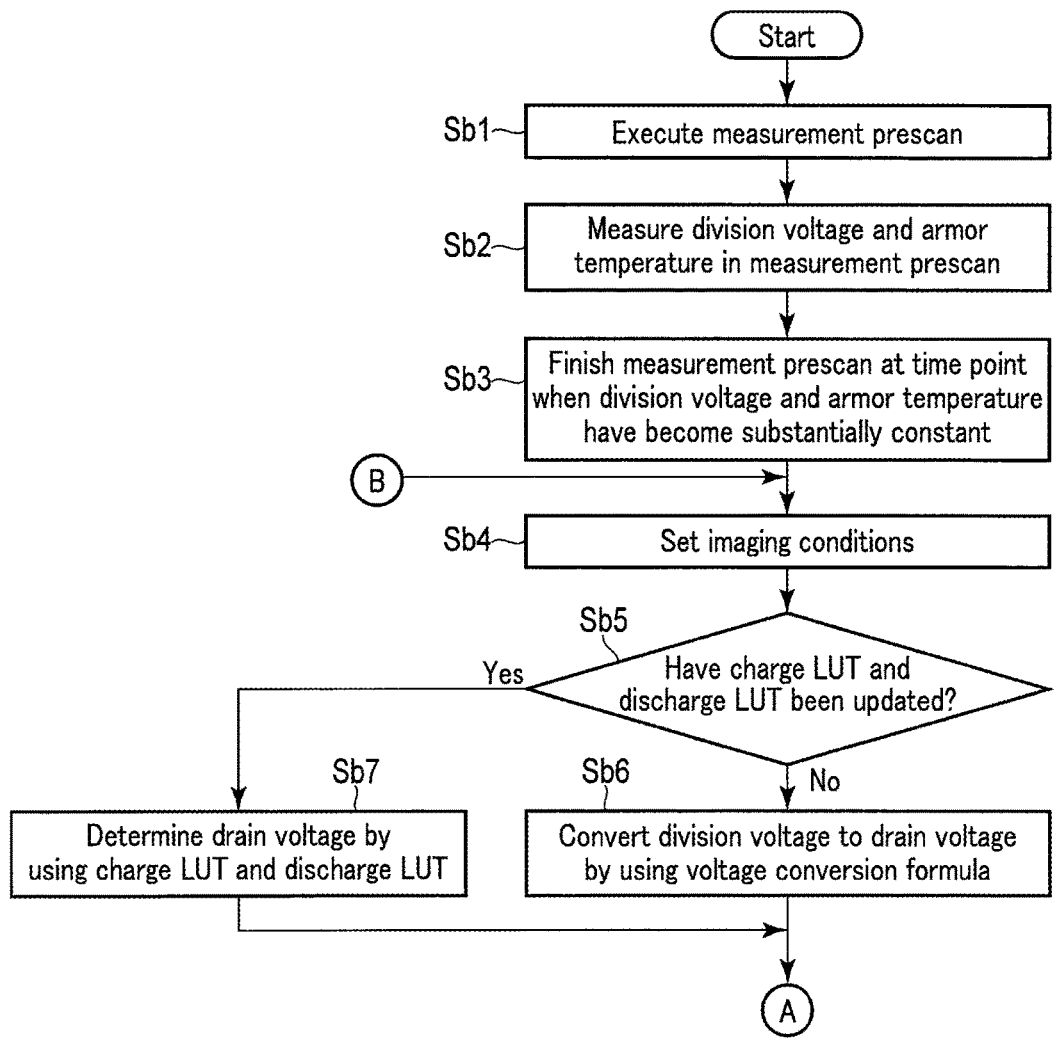
F I G. 12

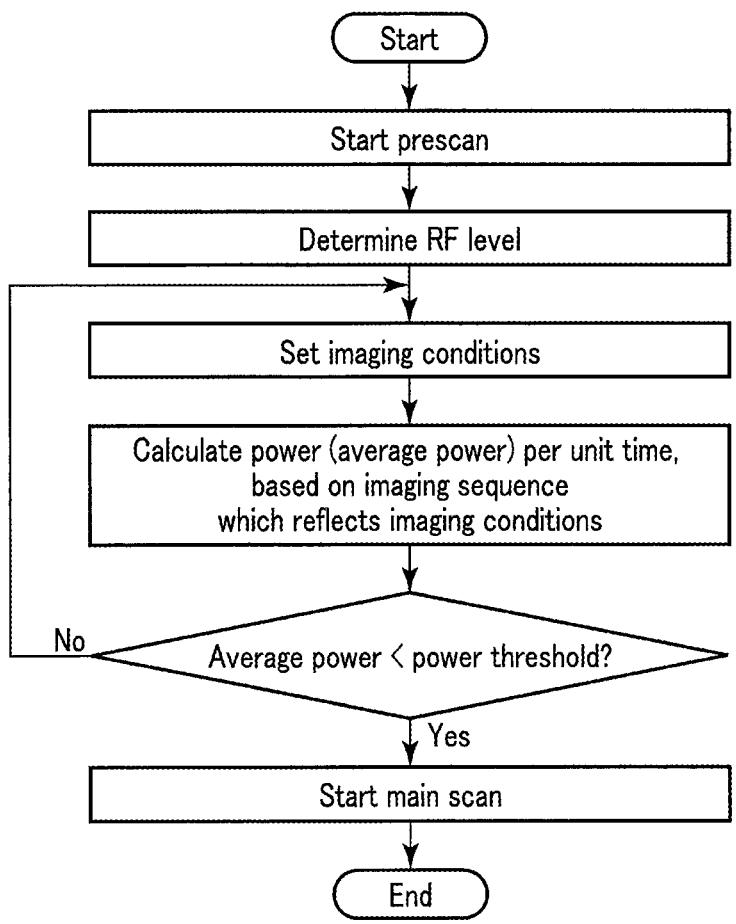
F I G. 14

MAGNETIC RESONANCE IMAGING APPARATUS

CROSS-REFERENCE TO RELATED APPLICATIONS

This application is based upon and claims the benefit of priority from the prior Japanese Patent Application No. 2016-047476, filed Mar. 10, 2016, the entire contents of which are incorporated herein by reference.

FIELD

Embodiments described herein relate generally to a magnetic resonance imaging apparatus.

BACKGROUND

In a magnetic resonance imaging apparatus, imaging parameters are set so as not to exceed a threshold of an average power defined by a pulse condition in a radio frequency amplifier. However, in the setting of imaging parameters by this method, the peak of an RF pulse is limited at a time of using the RF amplifier with high efficiency, and damage to the RF amplifier or system-down may occur.

BRIEF DESCRIPTION OF THE DRAWINGS

FIG. 4 relates to the first embodiment, and is a view illustrating an example of an efficiency of an FET (field effect transistor) relative to an output power which is output from the FET.

FIG. 8 is a view illustrating an example of the configuration of a transmitter and a transmitter coil according to a first modification of the first embodiment.

FIG. 12 is a view illustrating an example of a process flow of an operation according to the second embodiment.

FIG. 14 relates to prior art, and is a view illustrating the flow of a setting process of imaging parameters.

DETAILED DESCRIPTION

Figure 1:
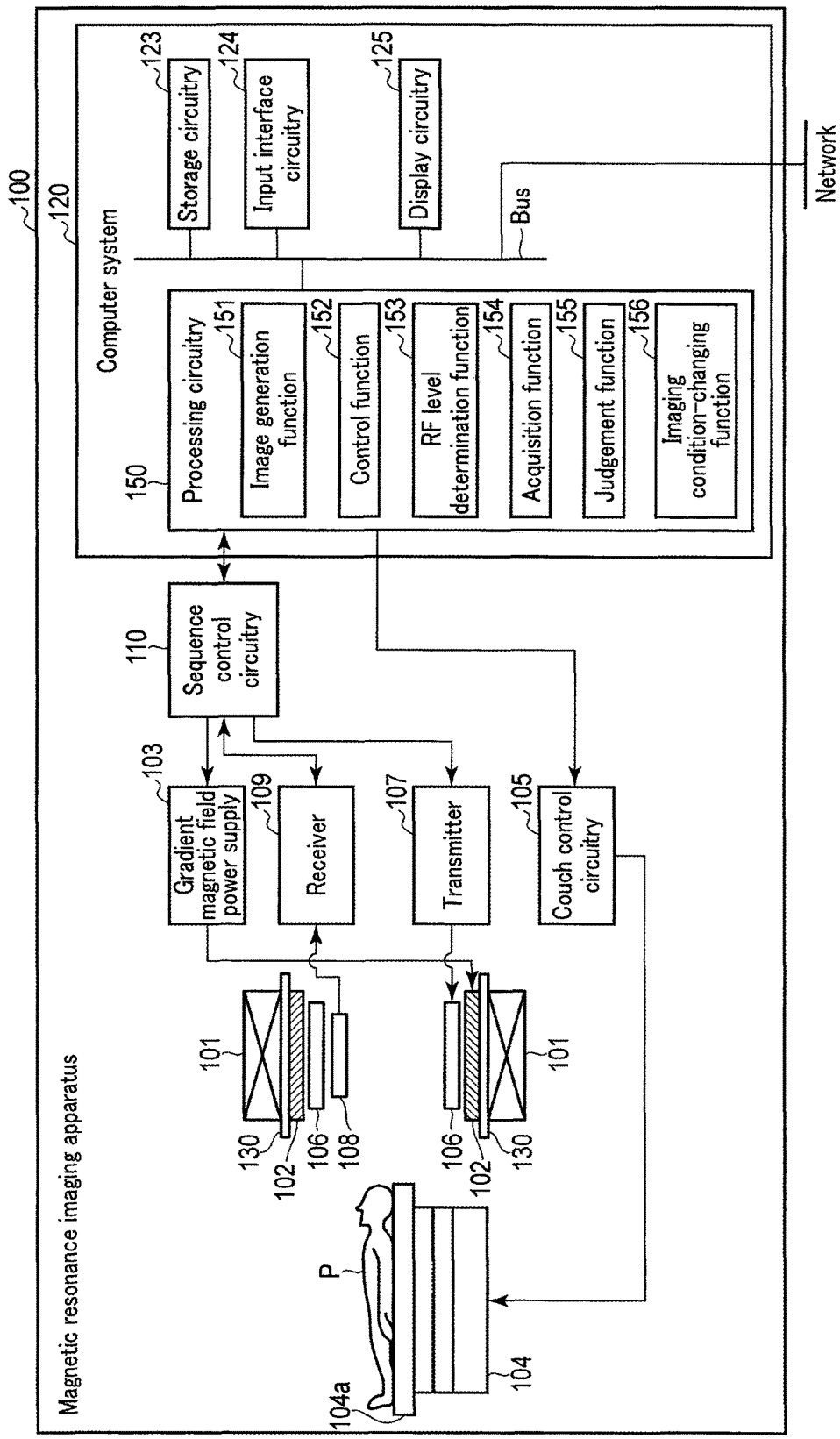
FIG. 1 is a block diagram illustrating an example of the configuration of a magnetic resonance imaging apparatus according to a first embodiment.

In general, according to one embodiment, a magnetic resonance imaging apparatus includes an amplifier, a capacitor bank, and processing circuitry. The amplifier supplies, based on an imaging sequence, an RF pulse to an RF coil which generates a radio frequency magnetic field. The capacitor bank supplies an electric power to the amplifier. The processing circuitry judges whether an imaging by the imaging sequence is able to be executed, based on a condition of the RF pulse in the imaging sequence and an output efficiency of the amplifier.

Hereinafter, a magnetic resonance imaging apparatus according to an embodiment will be described in detail with reference to the accompanying drawings. In the description below, structural elements having substantially the same function and structure are denoted by like reference numerals, and an overlapping description is given only where necessary.

First Embodiment

Referring to FIG. 1, a description is given of the entire configuration of a magnetic resonance imaging apparatus 100 according the embodiment. As illustrated in FIG. 1, the magnetic resonance imaging apparatus 100 includes a static field magnet 101, a shim coil 130, a gradient coil 102, a gradient magnetic field power supply 103, a couch 104, couch control circuitry 105, a transmitter coil 106, a transmitter 107, a receiver coil 108, a receiver 109, sequence control circuitry 110, and a computer system 120. The transmitter coil 106 and receiver coil 108 are comprehensively referred to as "RF (Radio Frequency) coil".

The static field magnet 101 is a magnet formed in a hollow cylindrical shape. The static field magnet 101 generates a uniform static field in the inside space. As the static field magnet 101, for example, a permanent magnet, a superconducting magnet, a resistive magnet, or the like is used.

The shim coil 130 is a coil which is formed in a hollow cylindrical shape in the inside of the static field magnet 101. The shim coil 130 is connected to a shim coil power supply (not shown). Using power supplied from the shim coil power supply, the shim coil 130 uniformizes the static field which the static field magnet 101 generates.

The gradient coil 102 is disposed in the inside of the static field magnet 101 and shim coil 130. The gradient coil 102 is formed in a hollow cylindrical shape by combining three coils (X-axis gradient coil, Y-axis gradient coil and Z-axis gradient coil) corresponding to X-, Y- and Z-axes which are orthogonal to each other. These three coils individually receive currents from the gradient magnetic field power supply 103, and generate gradient fields having field intensities varying along the X-, Y- and Z-axes. Incidentally, a Z-axis direction is a longitudinal direction of the couch 104. In addition, a Y-axis direction is a vertical direction, and an X-axis direction is a direction perpendicular to the Z-axis and Y-axis.

The gradient magnetic field power supply 103 supplies current to the gradient coil 102 under the control of the sequence control circuitry 110.

The couch 104 includes a couch top 104a on which a subject P is placed. Normally, the couch 104 is disposed such that the longitudinal direction of the couch 104 is parallel to the center axis of the static field magnet 101. The couch control circuitry 105 drives the couch 104 under the control by the computer system 120. By the driving of the couch 104, the couch top 104a moves in the longitudinal direction and in the up-and-down direction, and the couch top 104a in a state in which the subject P is placed thereon is inserted into a bore (imaging bore) of the gradient coil 102.

The transmitter coil 106 is disposed in the inside of the gradient coil 102. The transmitter coil 106 receives RF pulses which are supplied from the transmitter 107, and generates a radio frequency magnetic field. The transmitter 107 supplies to the transmitter coil 106 the RF pulses corresponding to a Larmor frequency which is determined by the kind of atomic nucleus that is a target, and the intensity of the magnetic field. Hereinafter, in order to make descriptions simpler, it is assumed that the transmitter coil is a single coil corresponding to one channel.

Figure 2:
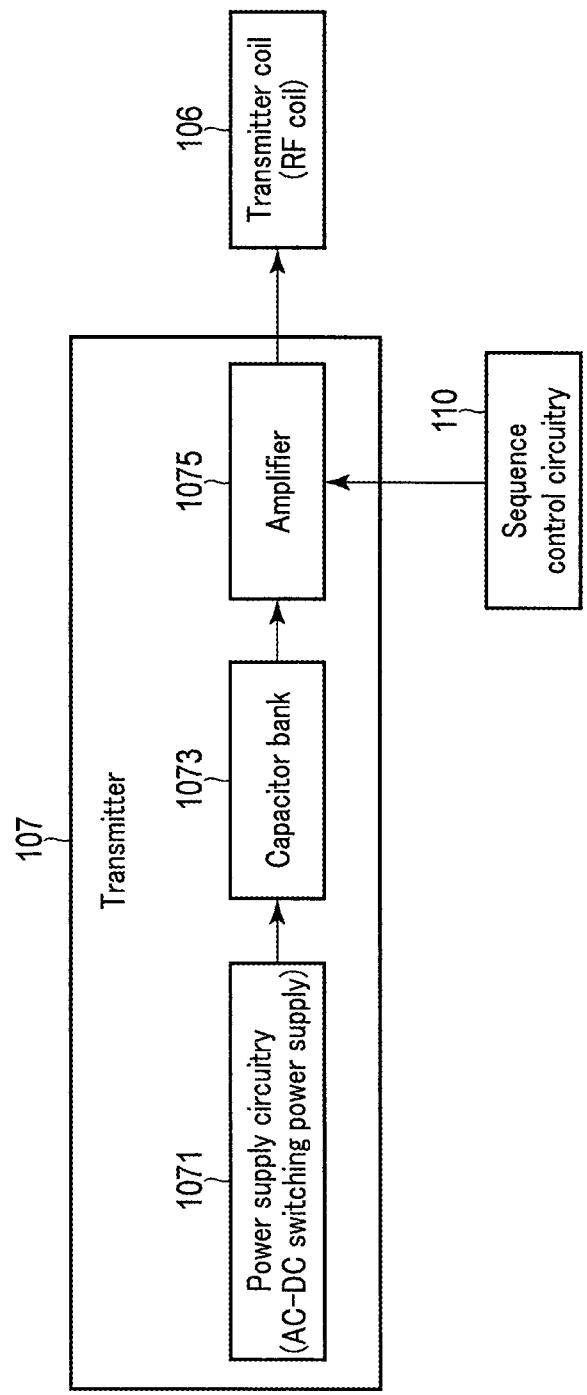
FIG. 2 is a view illustrating an example of the internal configuration of a transmitter according to the first embodiment.
Figure 3:
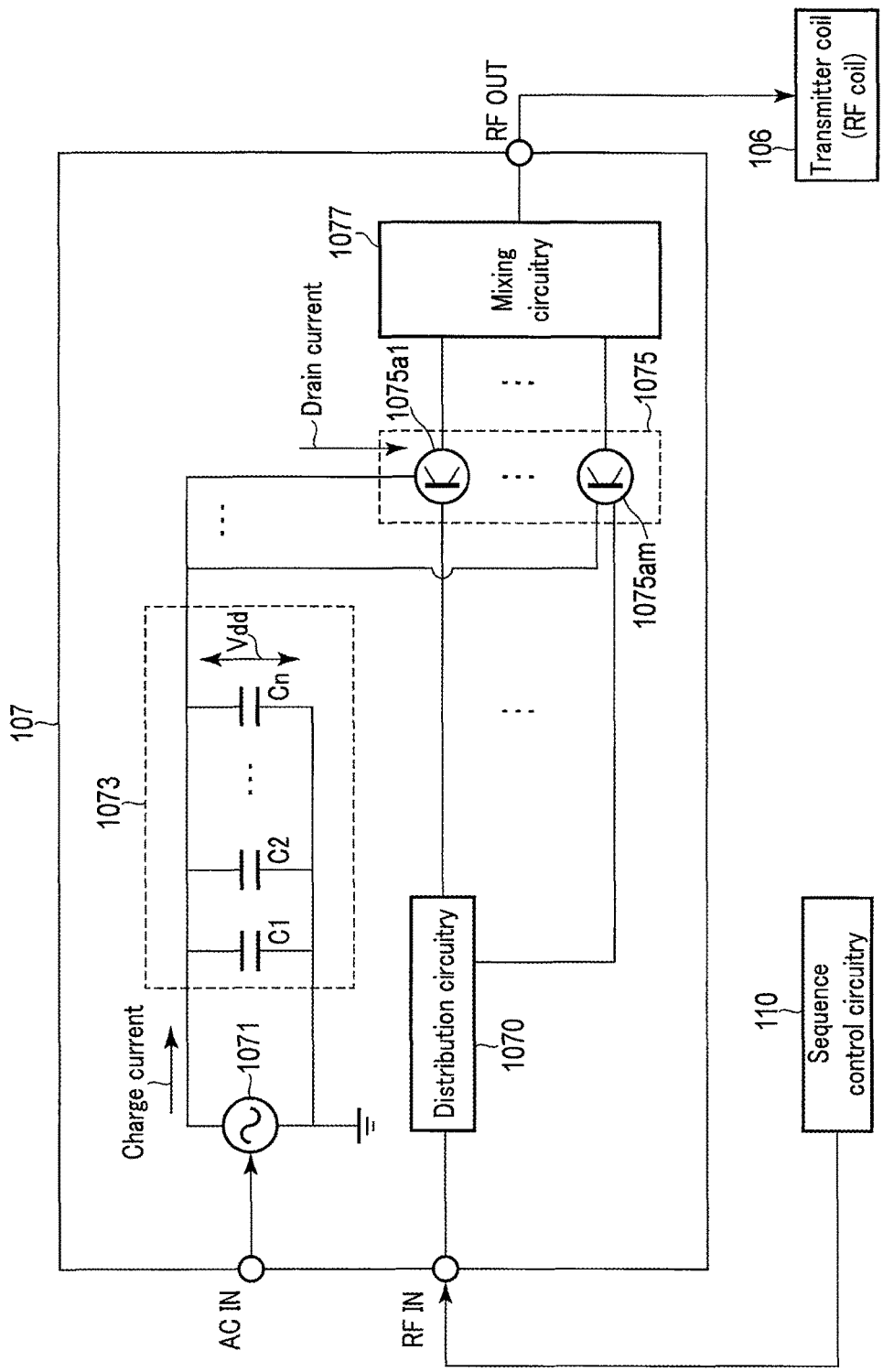
FIG. 3 is a view illustrating an example of the circuitry configuration of the transmitter according to the first embodiment.

FIG. 2 is a view illustrating an example of the internal configuration of the transmitter 107. As illustrated in FIG. 2, the transmitter 107 includes power supply circuitry 1071, a capacitor bank 1073, an amplifier 1075, distribution circuitry (not shown), and mixing circuitry (not shown). FIG. 3 is a view illustrating an example of the circuitry configuration in the transmitter 107. As illustrated in FIG. 3, the amplifier 1075 includes a plurality of amplifier elements (1075a1, . . . , 1075am: m is a natural number). The distribution circuitry 1070 distributes an RF signal, which is output from the sequence control circuitry 110, to the respective amplifier elements. Incidentally, the circuitry configuration of the transmitter 107 is not limited to the circuitry configuration as illustrated in FIG. 3.

The power supply circuitry 1071 is connected to the capacitor bank 1073. In accordance with the operation of the amplifier 1075, the power supply circuitry 1071 supplies necessary energy (power, voltage, and current) to the amplifier 1075 via the capacitor bank 1073. The power supply circuitry 1071 supplies energy to the capacitor bank 1073 which is provided between the power supply circuitry 1071 and the amplifier 1075. A concrete example of the power supply circuitry 1071 is a predetermined DC power supply (AC-DC switching power supply) which rectifies an alternating current that is output from, for example, an AC power supply. The AC-DC switching power supply 1071 converts an AC voltage of an external power supply to a DC voltage.

The capacitor bank 1073 stores electric charge which comes in from the power supply circuitry 1071, when the amplifier 1075 is not in operation, that is, when RF pulses are not being supplied to the transmitter coil 106. In order to compensate a voltage drop at the time of the operation of the amplifier 1075, the capacitor bank 1073 supplies power to the amplifier 1075, as needed. Specifically, the capacitor bank 1073 functions as a battery for supplying power that cannot be compensated by the power supply circuitry 1071. The capacitor bank 1073 includes, for example, a plurality of capacitors (C1, C2, . . . , Cn: n is a natural number) which are connected in parallel. The capacitor bank 73 corresponds to a large-capacity capacitor.

Here, the function of the capacitor bank 1073 is as follows. When large-power pulses are output to the transmitter coil 106, a drain current flows to the respective amplifier elements 1075a1 to 1075am from the capacitor bank 1073. At this time, since the charge accumulated in the capacitor bank 1073 decreases, a drain voltage Vdd, which indicates a voltage between both ends of the capacitor, drops.

In addition, when large-power pulses are not output to the transmitter coil 106, an electric current (charge current) is supplied to each of the capacitors (C1, . . . , Cn) from the AC-DC switching power supply 1071. At this time, the drain voltage Vdd can be increased up to a rated value which indicates the voltage value of the AC-DC switching power supply 1071. The present magnetic resonance imaging apparatus 100 intermittently uses the amplifier 1075 for the amplification of the RF signal. Thereby, the charging and discharging of the capacitor bank 1073 are repeated. From the above, even when the power supply amount, which is necessary for causing a large current to flow to the transmitter coil 106 in a short time, temporarily exceeds the power that is supplied by the power supply circuitry 1071, the power can stably be supplied to the transmitter coil 106 by the presence of the capacitor bank 1073.

The amplifier 1075 amplifies the RF signal and supplies the amplified RF signal to the transmitter coil 106 which transmits RF waves (a radio frequency magnetic field of pulse waves or a continuous wave). Specifically, the amplifier 1075 converts the RF signal to large-power pulses. The amplifier 1075 amplifies the RF signal, and outputs the amplified RF signal to mixing circuitry 1077. For example, the respective amplifier elements 1075a1 to 1075am amplify and convert the RF signals received from the sequence control circuitry 110 to large-power pulses, and then output the converted large-power pulses to the mixing circuitry 1077. Each of the amplifier elements 1075a1 to 1075am is, for example, an FET (Field Effect Transistor). Specifically, based on the imaging sequence, the amplifier 1075 supplies the RF pulses to the RF coil which generates a radio frequency magnetic field.

The mixing circuitry 1077 mixes output powers (large-power pulses) which are output from the respective amplifier elements 1075a1 to 1075am, and outputs the mixed voltage to the transmitter coil 106. Specifically, the mixing circuitry 1077 mixes the RF signals, which were amplified by the amplifier 1075, into one output, and delivers the one output to the transmitter coil 106 of the rear stage.

The receiver coil 108 is disposed in the inside of the gradient coil 102. The receiver coil 108 receives an MR (Magnetic Resonance) signal which is emitted from the subject P by the influence of the radio frequency magnetic field. Upon receiving the MR signal, the receiver coil 108 outputs the received MR signal to the receiver 109. For example, the receiver coil 108 is a coil array including one or more coil elements, typically a plurality of coil elements. In the meantime, both the transmitter coil 106 and the receiver coil 108 may be used as a single RF coil. The MR signals, which are output from the respective coil elements of the receiver coil 108 are properly distributed and mixed, and the resultant signal is output to the receiver 109 in units called "channels" or the like.

The receiver 109 generates MR data, based on the MR signal which is output from the receiver coil 108. The receiver 109 transmits the generated MR data to the sequence control circuitry 110. In the meantime, the receiver 109 may be provided on the side of a gantry apparatus including the static field magnet 101, gradient coil 102, etc. The MR data is handled on a channel-by-channel basis in a process of the rear stage of the receiver 109.

Based on the information of an imaging sequence, which is transmitted from the computer system 120, the sequence control circuitry 110 drives the gradient magnetic field power supply 103, transmitter 107 and receiver 109, and carries out imaging on the subject P. The information of the imaging sequence includes the magnitude and timing of a voltage which the gradient magnetic field power supply 103 supplies to the gradient coil 102; the intensity and timing of the RF signal which the transmitter 107 transmits to the transmitter coil 106; and the timing at which the receiver 109 detects the MR signal. The sequence control circuitry 110 transfers the MR data, which the sequence control circuitry 110 received from the receiver 109, to the computer system 120. The sequence control circuitry 110 is an example of a sequence controller.

The computer system 120 executes overall control of the magnetic resonance imaging apparatus 100, data acquisition, image generation, etc. The computer system 120 includes processing circuitry 150, storage circuitry 123, input interface circuitry 124, and display circuitry 125. In addition, the processing circuitry 150 includes various functions such as an image generation function 151, a control function 152, an RF level determination function 153, an acquisition function 154, a judgement function 155, and an imaging condition-changing function 156. The processing circuitry 150 is an example of a processor.

The storage circuitry 123 stores the MR data, the image data generated by the image generation function 151, imaging conditions, the information of the imaging sequence, etc. The imaging conditions are, for example, various imaging parameters such as a flip angle, TR (repetition time), and the number of slices. The storage circuitry 123 stores a waveform of RF pulses corresponding to the kind of imaging sequence. The storage circuitry 123 stores information of prescan which is executed before main scan on the subject P. The storage circuitry 123 corresponds to, for example, a RAM (Random Access Memory), a semiconductor memory element such as a flash memory, a hard disk, an optical disc, etc. The storage circuitry 123 stores various process functions, which are executed by the processing circuitry 150, in the form of programs. The storage circuitry 123 is an example of a storage unit.

The input interface circuitry 124 accepts various instructions and information inputs from the operator. The input interface circuitry 124 is, for example, a pointing device such as a mouse or a trackball, or an input device such as a keyboard. Incidentally, the input interface circuitry 124 is not limited to a device including a physical operation part, such as a mouse or a keyboard. Examples of the input interface circuitry 124 include processing circuitry of electric signals, which receives electric signals corresponding to an input operation from an external input device, which is provided separately from the magnetic resonance imaging apparatus 100, and outputs the received electric signals to various circuitry. The input interface circuitry 124 is an example of an input unit.

The display circuitry 125 causes a display to display various pieces of information such as image data, under the control of the control function 152 in the processing circuitry 150. The display is, for example, a display device such as a liquid crystal display. The display circuitry 125 is an example of a display unit.

The processing circuitry 150 reads out, from the storage circuitry 123, various programs relating to the operation according to this embodiment, in response to a start instruction of prescan via the input interface circuitry 124. The processing circuitry 150 is a processor which realizes the functions corresponding to the programs. The processing circuitry 150 in the state in which the processing circuitry 150 has read out the programs includes the respective functions illustrated in the processing circuitry 150 in FIG. 1. In the meantime, in FIG. 1, the description was given on the assumption that the various processing functions, such as the image generation function 151, control function 152, RF level determination function 153, acquisition function 154, judgement function 155 and imaging condition-changing function 156, are realized by the single processing circuitry 150. However, the processing circuitry 150 may be constituted by combining a plurality of independent processors, and the respective processors may realize the functions by executing the programs. In other words, there may be either a case in which the above-described various functions are composed as programs and the single processing circuitry executes the respective programs, or a case in which a specific function is implemented in independent purpose-specific program-executing circuitry.

The term "processor" used in the above description means, for example, a CPU (Central Processing Unit), a GPU (Graphics Processing Unit), or circuitry such as an ASIC (Application Specific Integrated Circuit), or a programmable logic device (e.g. SPLD (Simple Programmable Logic Device), CLPD (Complex Programmable Logic Device), FPGA (Field Programmable Gate Array)).

The processors realize the various functions by reading out and executing the programs stored in the storage circuitry 123. In the meantime, instead of storing the programs in the storage circuitry 123, such a configuration may be adopted that the programs are directly incorporated in the circuitry in the processors. In this case, the processors realize the various functions by reading out and executing the programs incorporated in the circuitry in the processors. Incidentally, the couch control circuitry 105, transmitter 107, receiver 109 and sequence control circuitry 110 may similarly include electronic circuitry such as the above-described processors.

The processing circuitry 150 transmits the information of the imaging sequence to the sequence control circuitry 110, and receives the MR data from the sequence control circuitry 110. If the processing circuitry 150 receives the MR data, the processing circuitry 150 stores the received MR data in the storage circuitry 123. The processing circuitry 150 generates images by the image generation function 151, by using the received MR data and the data stored in the storage circuitry 123. The processing circuitry 150 transmits, where necessary, the images obtained by the image generation function 151 to the display or storage circuitry 123. The processing circuitry 150, which realizes the image generation function 151, is an example of an image generator. The processing circuitry 150 executes overall control of the magnetic resonance imaging apparatus 100 by the control function 152. For example, the processing circuitry 150 generates the information of the imaging sequence, based on imaging conditions which are input by an operator through the input interface circuitry 124. The processing circuitry 150, which realizes the control function 152, is an example of a controller.

The processing circuitry 150 determines, by the RF level determination function 153, an RF level which indicates a level of power that is supplied to the transmitter coil 106, based on a transmission/reception result of the RF wave via the RF coil, after the execution of the prescan of the imaging sequence relating to the main scan. The RF level is a level indicating the power for turning, for example, the spin of an atom in the subject P by 90°. Specifically, the RF level corresponds to the power of the RF pulse, and corresponds to the amplitude of the RF pulse. In other words, the processing circuitry 150 determines the amplitude of the RF pulse, based on a radio frequency magnetic field which was transmitted/received to/from the subject P via the RF coil. The processing circuitry 150 calculates power for turning the spin at an arbitrary angle, based on the RF level and a predetermined mathematical expression. The processing circuitry 150, which realizes the RF level determination function 153, is an example of an RF level determination unit.

The configuration, etc. of the magnetic resonance imaging apparatus 100 according to the present embodiment have been described above. With this configuration, in the magnetic resonance imaging apparatus 100 according to the embodiment, the possibility/impossibility of the execution of imaging by the imaging sequence is judged based on the condition of the RF pulse in the imaging sequence and the output efficiency of the amplifier 1075. For example, the magnetic resonance imaging apparatus 100 according to the embodiment calculates a drain voltage and a junction temperature (to be described later), and judges the possibility/impossibility of the execution of main scan, by comparing the calculated drain voltage and a first threshold and by comparing the calculated junction temperature and a second threshold. Hereinafter, the magnetic resonance imaging apparatus 100 according to the present embodiment will be described in detail.

FIG. 4 is a view illustrating an example of an efficiency of an FET relative to an output power which is output from the FET in the amplifier 1075. The efficiency of the FET is a ratio of output power to input power which is input to the FET from the power supply circuitry 1071 and capacitor bank 1073, and corresponds to a power efficiency, that is, the output efficiency of the amplifier 1075. The FET has a characteristic of power loss due to the power efficiency as illustrated in FIG. 4. Although the power efficiency of the FET depends on the FET that is used in the amplifier 1075, the characteristic of the power efficiency relative to the input power is constant in the transmitter 107. The power efficiency of the FET is expressed by, for example, a percentage of a value which is obtained by dividing a multiplication value by an addition value. The multiplication value is obtained by multiplying an output period, during which output power is output from the FET, by the output power. The addition value is obtained by adding the multiplication value to power loss of the FET during the output period. In other words, the power loss of the FET corresponds to a value that is obtained by multiplying, by the multiplication value, a difference value between a value, which is obtained by dividing 100 by the power efficiency, and 1.

The storage circuitry 123 stores a loss calculation formula for calculating the power loss relative to the output power. The calculation formula becomes a formula in which a difference value between a value, which is obtained by dividing 100 by the power efficiency, and 1 is multiplied by the multiplication value. In the meantime, the storage circuitry 123 may store, instead of the loss calculation formula, a loss LUT (look up table) which indicates a table of correspondency of the power loss to output power. The storage circuitry 123 stores the power loss of the FET, the ambient temperature of the amplifier 1075, and the heat resistance of the amplifier 1075. The storage circuitry 123 stores a temperature calculation formula for calculating the temperature of the amplifier 1075 by using the power loss, ambient temperature and heat resistance. The temperature of the amplifier 1075 is, a junction temperature at a connection part between the FET and an armor or the like of the FET. The temperature of the amplifier 1075 is a temperature which indicates a caloric value of the amplifier 1075 due to the operation of the FET, and corresponds to a heat loss amount. The ambient temperature is, for example, a temperature of the vicinity of a heat sink provided on the armor of the FET. The heat resistance of the amplifier 1075 corresponds to, for example, the heat resistance of the FET. The temperature calculation formula is, for example, a formula in which the ambient temperature is added to a value which is obtained by multiplying the heat resistance by the power loss. In the meantime, the storage circuitry 123 may store, instead of the temperature calculation formula, a temperature LUT which indicates a table of correspondency of the junction temperature to the power loss.

The storage circuitry 123 stores a time constant which is expressed by a product CR between a resistance R between the power supply circuitry 71 and capacitor bank 1073, on one hand, and a capacitance C of the capacitor bank 1073, on the other hand, and also stores a drain voltage $Vdd_0$ at a discharge start time point. When the capacitor bank 1073 is completely charged, the drain voltage $Vdd_0$ at the discharge start time point corresponds to a constant voltage $V_0$ of the power supply circuitry 1071. In addition, when the capacitor bank 1073 was recharged after discharge, the drain voltage $Vdd_0$ at the discharge start time point corresponds to a post-charge drain voltage $Vdd_{fch}$ which is calculated by a charge calculation formula (to be described later).

The storage circuitry 123 stores a discharge calculation formula for calculating the influence of discharge of the capacitor 1073 by the imaging sequence, by using the time constant and the drain voltage $Vdd_0$. The influence of discharge is, for example, a variation with time of the drain voltage Vdd due to the discharge of the capacitor bank 1073. In the meantime, the storage circuitry 123 may store, instead of the discharge calculation formula, a discharge LUT indicating a table of correspondency of the drain voltage Vdd to a discharge time $t_{dc}$. The discharge calculation formula is, for example, a formula in which an exponential function is multiplied by a drain voltage $Vdd_b$ before discharge, the exponential function having as a base the Napier's constant (base of natural logarithm), and having as an exponent part a minus of a ratio of the discharge time $t_{dc}$ to the time constant CR. In the meantime, the storage circuitry 123 may store, instead of the discharge calculation formula, a table of correspondency of the drain voltage Vdd to the discharge time $t_{dc}$. The storage circuitry 123 stores a plurality of drain voltages calculated by the discharge calculation formula along a time sequence. Hereinafter, the drain voltage at a time point when the discharge of the capacitor bank 1073 has been finished is referred to as "post-discharge drain voltage $Vdd_{fdc}$".

The storage circuitry 123 stores the constant voltage $V_0$, and a chargeable ratio which is expressed by a ratio of a difference between the constant voltage $V_0$ and post-discharge drain voltage $Vdd_{fdc}$ to the constant voltage $V_0$. The storage circuitry 123 stores a charge calculation formula for calculating the influence of charge of the capacitor bank 107 by the imaging sequence by using the time constant, the constant voltage $V_0$ and the chargeable ratio. The influence of charge is, for example, a variation with time of the drain voltage Vdd due to the charge of the capacitor bank 1073. In the meantime, the storage circuitry 123 may store, instead of the charge calculation formula, a charge LUT indicating a table of correspondency of the drain voltage Vdd to a charge time $t_{ch}$. The charge calculation formula is, for example, a formula in which a term, in which a product between an exponential function and the chargeable ratio is subtracted from 1, is multiplied by the constant voltage $V_0$, the exponential function having as a base the Napier's constant (base of natural logarithm), and having as an exponent part a minus of a ratio of the charge time $t_{ch}$ to the time constant CR. In the meantime, the storage circuitry 123 may store, instead of the charge calculation formula, a table of correspondency of the drain voltage Vdd to the charge time $t_{ch}$. The storage circuitry 123 stores a plurality of drain voltages calculated by the charge calculation formula along a time sequence. The post-charge drain voltage $Vdd_{fch}$ is a drain voltage at a time point when the charge to the capacitor bank 1073 has been finished. The charge calculation formula and the discharge calculation formula indicate charge/discharge characteristics of the capacitor bank 1073 by the imaging sequence.

The storage circuitry 123 stores a first threshold for the post-discharge drain voltage $vdd_{fdc}$ and a second threshold for the junction temperature. The first threshold and second threshold are values for judging the possibility/impossibility of the execution of imaging by the imaging sequence. Specifically, the first threshold is a threshold for judging the possibility/impossibility of output of large-power pulses which are requested by the imaging sequence, when the imaging by the imaging sequence is executed. In addition, the second threshold is a threshold for judging the possibility/impossibility of damage of the FET or the possibility/impossibility of system-down by the operation of protection circuitry of the FET.

The input interface circuitry 124 inputs a start instruction of an operation for comprehensively executing the RF level determination function 153, acquisition function 154, judgement function 155 and imaging condition-changing function 156. The input interface circuitry 124 inputs values of imaging parameters indicating the imaging conditions, etc., by the instruction of the operator.

The processing circuitry 150 acquires, by the acquisition function 154, the junction temperature in accordance with the imaging sequence of the main scan based on the RF level. Specifically, the processing circuitry 150 calculates the power loss of the FET by using the loss calculation formula, based on the imaging parameters and RF level. Next, the processing circuitry 150 calculates the junction temperature by using the temperature calculation formula, based on the ambient temperature, heat resistance and power loss. Specifically, the processing circuitry 150 estimates the junction temperature in a case in which the imaging sequence was supposed to be executed, by using the temperature calculation formula, based on the imaging parameters, RF level, ambient temperature, heat resistance, and power loss formula. In other words, the processing circuitry 150 finds (calculates) the heat loss amount in the amplifier 1075, based on the output efficiency of the amplifier 1075.

The processing circuitry 150 acquires, by the acquisition function 154, the voltage of the capacitor bank 1073 in accordance with the imaging sequence of the main scan. Specifically, the processing circuitry 150 calculates the drain voltage, based on the charge/discharge characteristics of the capacitor bank by the imaging sequence relating to the main scan. In other words, the processing circuitry 150 estimates the drain voltage in a case in which the imaging sequence was supposed to be executed, by using the imaging parameters, RF level, charge/discharge characteristics and output efficiency. The drain voltage, which was estimated at the time of discharge, corresponds to a voltage drop of the capacitor bank 1073. To be more specific, the processing circuitry 150 calculates the voltage drop in the capacitor bank 1073, based on the conditions of the RF pulses in the imaging sequence and the output efficiency of the amplifier 1075. The conditions of RF pulses are, for example, the amplitude (RF level) which corresponds to the power of RF pulses, the waveform of RF pulses which are stipulated by the imaging sequence, and the timing of application and the application time of RF pulses. The waveform of RF pulses is a sinc function, a rectangular shape, a trapezoidal shape, or the like, which is associated in advance in accordance with the kind of imaging sequence relating to the main scan. Specifically, the processing circuitry 150 calculates the voltage drop by taking into account the output efficiency of the FET, the waveform of the RF pulses corresponding to the kind of imaging sequence of the main scan, and the amplitude of the RF pulses. The processing circuitry 150, which realizes the acquisition function 154, is an example of an acquisition unit.

The processing circuitry 150 judges, by the judgement function 155, the possibility/impossibility of execution of imaging by the imaging sequence, based on the conditions of RF pulses in the imaging sequence and the output efficiency of the amplifier 1075. In other words, based on the voltage drop calculated by the acquisition function 154, the processing circuitry 150 judges the possibility/impossibility of execution of imaging by the main scan. To be more specific, the processing circuitry 150 judges the possibility/impossibility of execution of the main scan, based on the junction temperature (heat loss amount) and the drain voltage (voltage drop). Concretely, the processing circuitry 150 reads out the first threshold from the storage circuitry 123, and compares the first threshold and the acquired drain voltage. In addition, the processing circuitry 150 reads out the second threshold from the storage circuitry 123, and compares the second threshold and the acquired junction temperature. When the drain voltage is not greater than the first threshold or when the junction temperature is not less than the second threshold, the processing circuitry 150 judges that the imaging conditions in the imaging sequence need to be changed. When the drain voltage is greater than the first threshold and the junction temperature is less than the second threshold, the processing circuitry 150 judges that the main scan by the imaging sequence is executable. At this time, in order to execute the main scan, the processing circuitry 150 controls the sequence control circuitry 110. The processing circuitry 150, which realizes the judgement function 155, is an example of a judgement unit.

When it was judged that the imaging conditions in the imaging sequence need to be changed, the processing circuitry 150 changes the imaging conditions by the imaging condition-changing function 156. Specifically, the processing circuitry 150 changes the imaging conditions, such as the flip angle, TR and the number of slices, which are displayed on the display, to values which were input by the operator. Using the changed imaging conditions, the processing circuitry 150 re-executes the acquisition function 154 and judgement function 155. The processing circuitry 150, which realizes the imaging condition-changing function 156, is an example of an imaging condition-changing unit.

When it was judged by the judgement function 155 that the imaging by the imaging sequence is not executable, the display circuitry 125 displays an input screen for changing the imaging conditions. The display circuitry 125 may further display a predetermined alert, the judgement result by the judgement function 155, the drain voltage, the junction temperature, the first threshold, and the second threshold.

(Operation)

Figure 5:
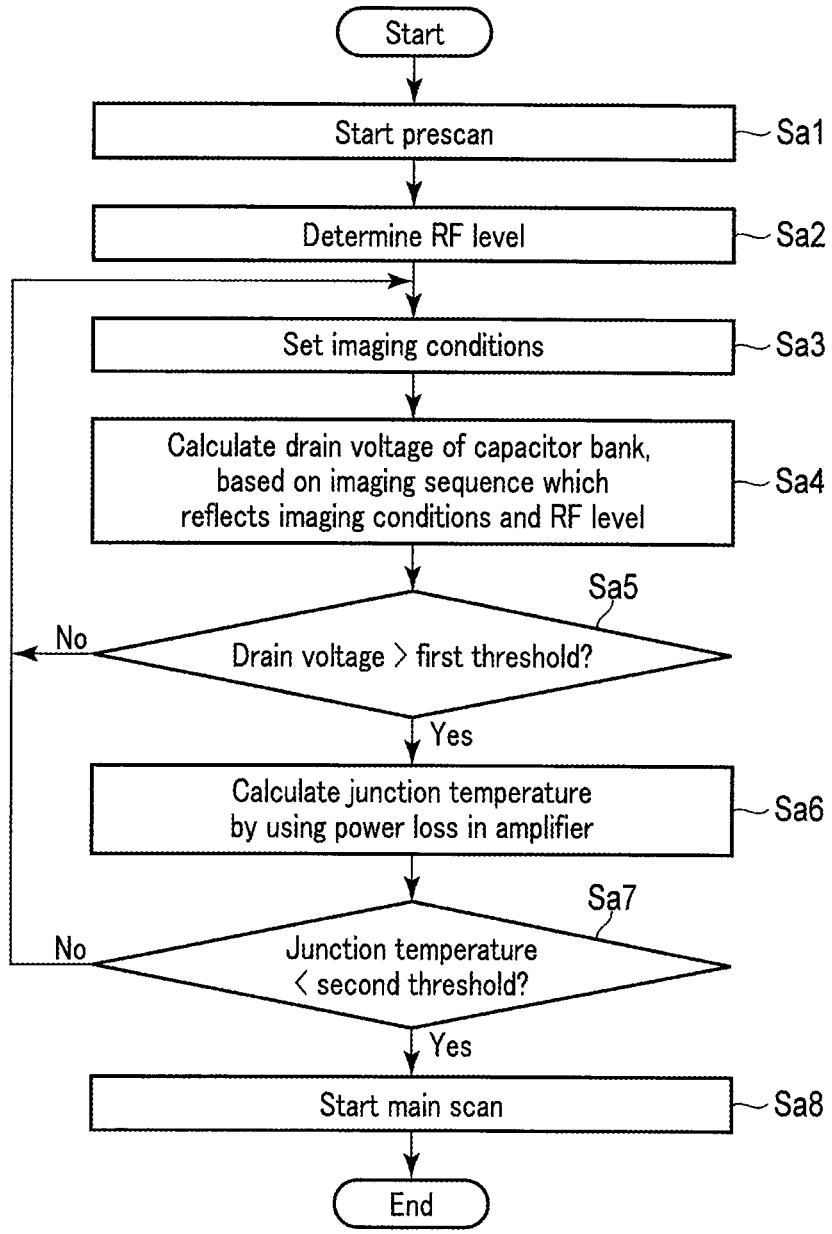
FIG. 5 is a flowchart illustrating an example of a process flow of an operation according to the first embodiment.

An operation relating to the present embodiment will be described. FIG. 5 is a flowchart illustrating an example of a process flow of the operation according to the embodiment.

The waveform of RF pulses is determined in accordance with the imaging sequence of the main scan. In accordance with an instruction of the operator through the input interface circuitry 124, prescan is started by using the determined waveform of RF pulses (step Sa1). The RF level is determined based on a transmission/reception result of test RF waves in the prescan (step Sa2). Specifically, under the control of the sequence control circuitry 110, a plurality of test RF waves of different transmission powers are transmitted to the subject P, and the amplitudes of a plurality of free induction decay signals (FID signals), which correspond to the plural test RF waves, are acquired. Next, the processing circuitry 150 determines a transmission power, which corresponds to the greatest amplitude of the plural FID amplitudes corresponding to the plural transmission powers, as the RF level, that is, as the amplitude of RF pulses.

Responding to the determination of the RF level, the display displays the input screen of imaging conditions. The imaging conditions, such as the flip angle, TR and the number of slices, are set by an instruction of the operator through the input interface circuitry 124 (step Sa3). The drain voltage of the capacitor bank 1073 is calculated based on the imaging sequence which reflects the set imaging conditions and the determined RF level (step Sa4). Specifically, the drain voltage Vdd of the FET is calculated by applying the imaging parameters, which were input through the input interface circuitry 124, and the RF level, to the discharge calculation formula (or discharge LUT) and charge calculation formula (or charge LUT). In other words, based on the condition of RF pulses and the output efficiency, the voltage drop in the capacitor bank 1073 is calculated.

Figure 6:
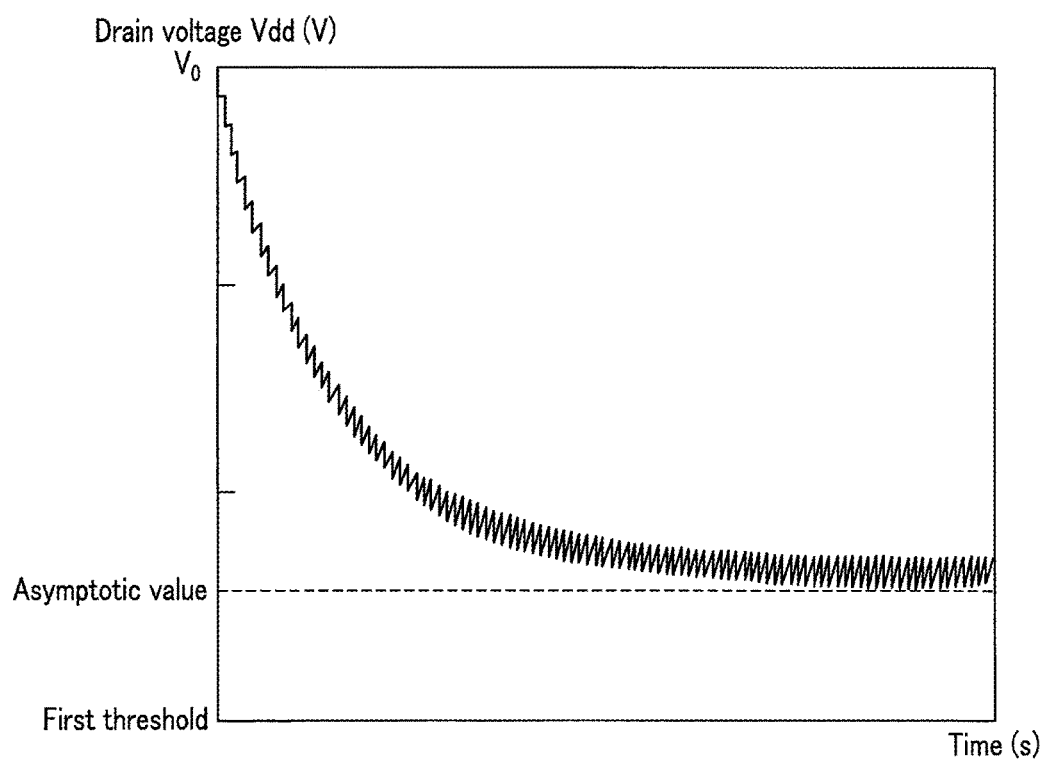
FIG. 6 relates to the first embodiment, and is a view illustrating an example of a variation with time of a drain voltage, which was calculated by processing circuitry.
Figure 7:
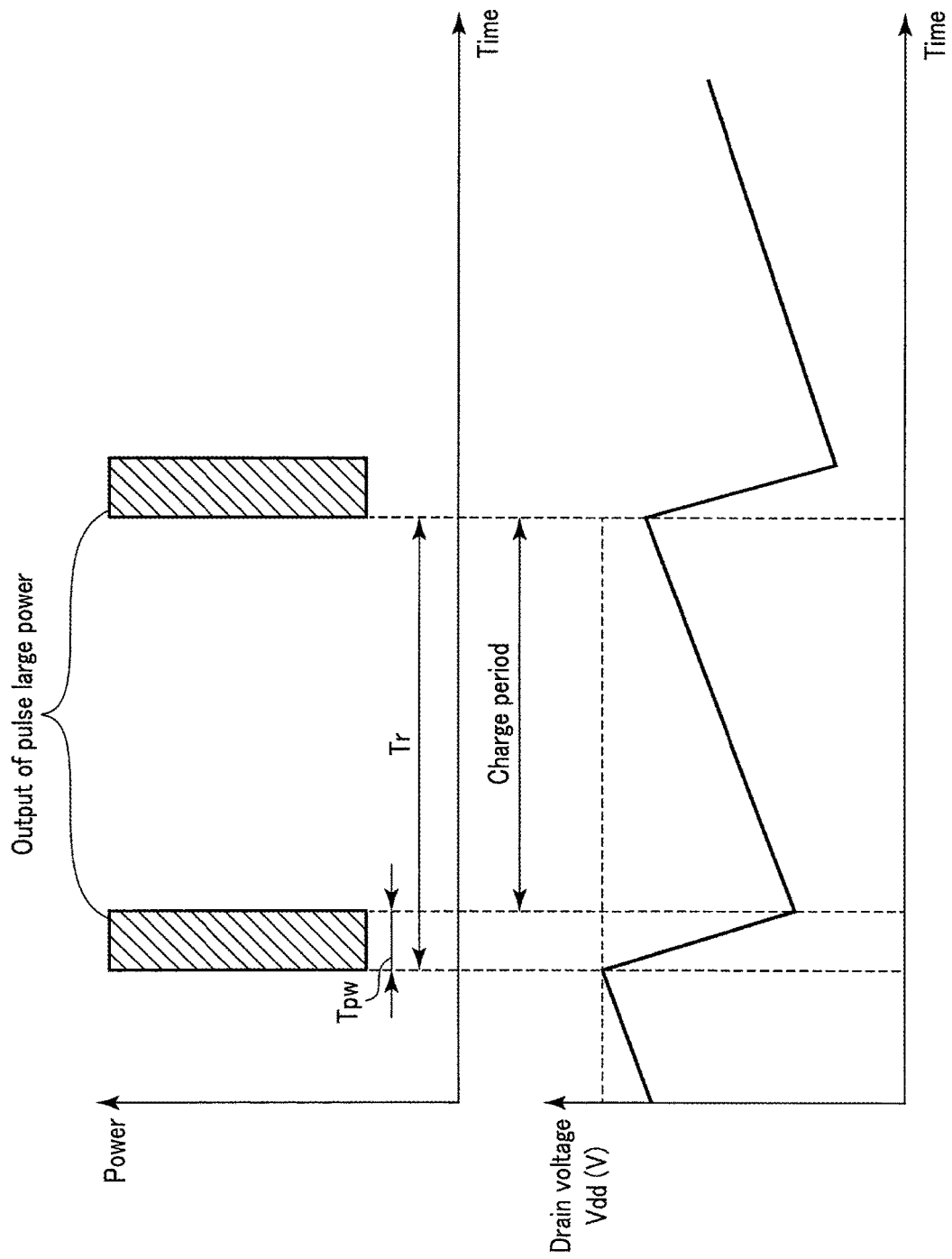
FIG. 7 is a view illustrating, together with the presence/absence of an output of a pulse large power, enlarged portions in which a rising portion and a falling portion of the drain voltage in FIG. 6 are enlarged.

FIG. 6 is a view illustrating an example of a variation with time of the drain voltage Vdd, which was calculated by the processing circuitry 150. FIG. 7 is a view illustrating, together with the presence/absence of an output of a pulse large power, enlarged portions in which a rising portion and a falling portion of the drain voltage Vdd in FIG. 6 are enlarged. As illustrated in FIG. 6 and FIG. 7, when a large-power pulse with a pulse width Tpw is output to the transmitter coil 106, a drain current flows to the FET, and, as a result, the charge in the capacitor bank decreases. Thus, the drain voltage Vdd drops. On the other hand, during a charge period in which the large-power pulse is not output to the transmitter coil 106, the drain voltage Vdd rises by the supply of a charge current from the AC-DC switching power supply 1071. When a pulse large power is output at regular intervals, the lowest value of the drain voltage Vdd continually approaches a predetermined asymptotic value with the passing of time, as illustrated in FIG. 6. The time point, at which the calculation of the drain voltage is finished, is, for example, a time point at which the time-varying drain voltage decreases and stabilizes at the asymptotic value, that is, at a time point at which the drain voltage has become substantially constant.

If the drain voltage is not greater than the first threshold (No in step Sa5), the process of step Sa3 and step Sa4 is repeated. If the drain voltage is greater than the first threshold (Yes in step Sa5), the junction temperature, which indicates the caloric value of the amplifier 1075, is calculated by using the power loss in the amplifier 1075 (step Sa6). Specifically, the processing circuitry 150 calculates the power loss of the FET by applying the input imaging parameters and RF level to the loss calculation formula (or loss LUT). Next, the junction temperature is calculated by applying the ambient temperature, heat resistance and power loss to the temperature calculation formula (or temperature LUT). The period of calculation of the junction temperature by the processing circuitry 150 does not span the entirety of the imaging sequence, and terminates, for example, at the time point when the time-varying junction temperature has become substantially constant.

If the junction temperature is not less than the second threshold (No in step Sa7), the process of step Sa3 to step Sa6 is repeated. If the junction temperature is less than the second threshold (Yes in step Sa7), the main scan is started (step Sa8). In the meantime, the processing order of the process of step Sa4 and step Sa5 and the process of step Sa6 and step Sa7 may be reversed. In addition, the processing circuitry 150 may change the imaging conditions, by using as a trigger either the drain voltage or the junction temperature, which has reached the threshold earlier. Besides, when the main scan is a wide-area imaging such as the imaging of the entire body of the subject P, the process of steps Sa1 to Sa7 may be repeatedly executed, for example, by executing prescan for each of the imaging regions of the subject P.

Hereinafter, the advantageous effects of the present embodiment will be described in comparison with prior art.

Figure 15:
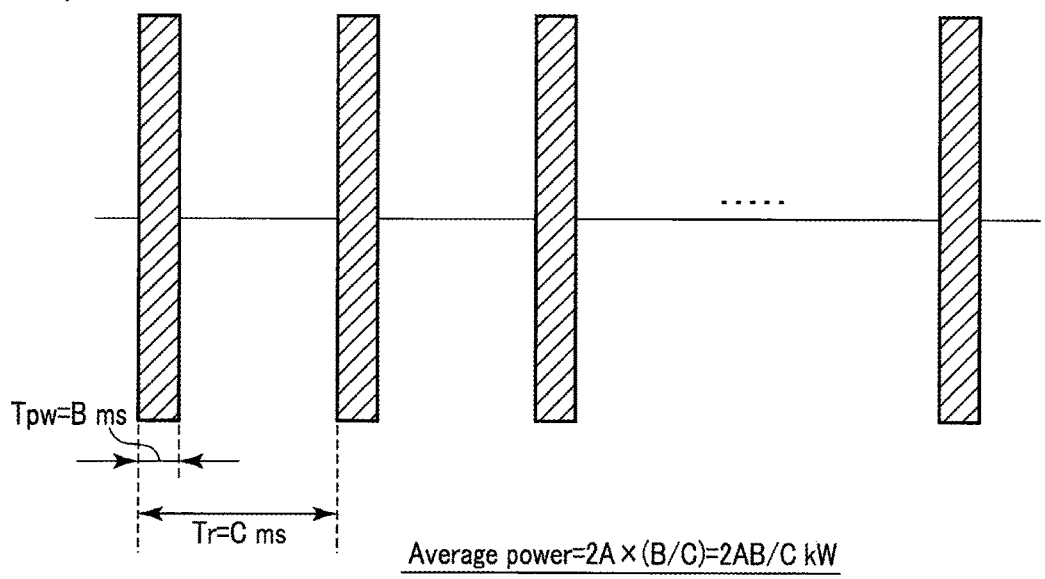
FIG. 15 relates to prior art, and is a view illustrating a pulse condition and a calculation of average power.
Figure 16:
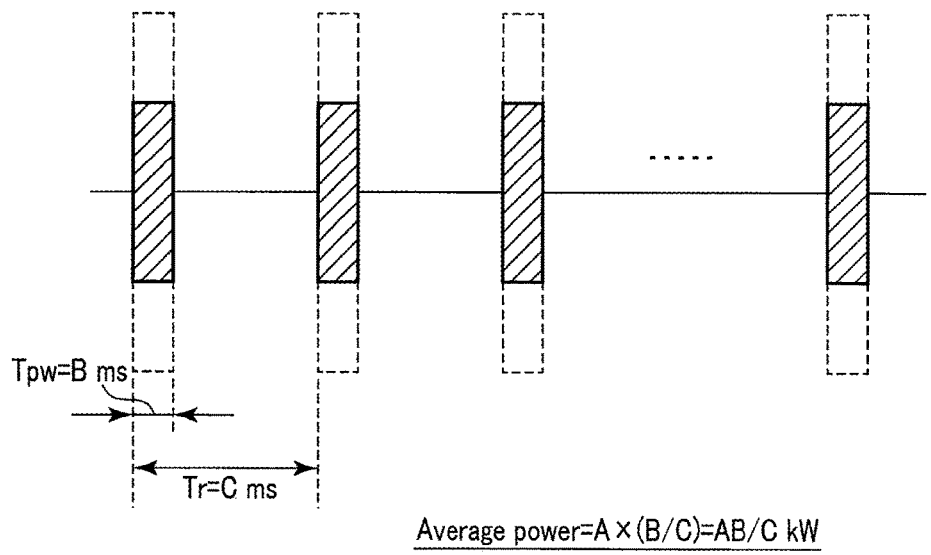
FIG. 16 relates to prior art, and is a view illustrating a pulse condition and a calculation of average power.

Conventionally, as illustrated in FIG. 14, the imaging parameters of the imaging sequence in the magnetic resonance imaging apparatus are set so as not to exceed a threshold of average power which is defined in a radio frequency amplifier. In general, an outputtable average power or one-pulse energy of the radio frequency amplifier is defined based on one pulse condition. Since the efficiency of the radio frequency amplifier varies depending on pulse conditions, the power supply load on the radio frequency amplifier and the temperature rise of the FET are different even if the average power is the same, and the power consumption of the radio frequency amplifier is different. For example, the average power of the pulse condition illustrated in FIG. 15 is 2AB/C kW. However, when the threshold of average power is AB/C kW, the peak power is limited to A kW, as illustrated in FIG. 16, and the flip angle is controlled such that the average power becomes AB/C kW. Thus, depending on the threshold of average power, there is a case in which the RF pulse can be output, or a case in which the RF pulse cannot be output. For example, if the peak of the RF pulse is limited at the time of using the RF amplifier with high efficiency, there is a case in which the power supply circuitry is used with a power margin. In addition, when the RF amplifier is used with low efficiency, it is possible that damage to the RF amplifier occurs or system-down by the operation of the protection circuitry occurs, due to the power supply load on the RF amplifier or the temperature rise of the FET in the RF amplifier.

On the other hand, according to the magnetic resonance imaging apparatus 100 of the present embodiment, the possibility/impossibility of execution of imaging by the imaging sequence can be judged based on the condition of RF pulses in the imaging sequence and the output efficiency of the amplifier 1075. Specifically, according to the magnetic resonance imaging apparatus 100, based on the RF level and imaging conditions which were determined by prescan, the junction temperature of the FET and the drain voltage are calculated. When the drain voltage is not greater than the first threshold or when the junction temperature is not less than the second threshold, the imaging conditions can be changed. Specifically, according to this embodiment, the imaging conditions can be changed without using the power threshold which is defined in the amplifier 1075. From the above, according to the present embodiment, the amplifier 1075 in the transmitter 107 can be used with a high load, and the risk of damage to the amplifier 1075 or system-down can be eliminated when the amplifier 1075 is used under the pulse conditions with low efficiency.

First Modification

A first modification of the first embodiment differs from the first embodiment in that the first modification includes a transmitter 107 which can transmit RF waves by a plurality of channels, and it is judged that imaging conditions need to be changed, when the total of voltage drops of drain voltages of a plurality of amplifier circuits corresponding to the plural channels is not greater than a first threshold, or when the junction temperature of at least one of the amplifier circuits is not less than a second threshold.

FIG. 8 is a view illustrating an example of the configuration of the transmitter 107 and transmitter coil 106 according to the present modification. As illustrated in FIG. 8, the transmitter coil 106 includes a plurality of coil elements. In addition, the amplifier 1075 includes the plurality of amplifier circuits corresponding to the plural channels. Each of the amplifier circuits includes a plurality of amplifier elements (FETs), as illustrated in FIG. 3. The plural amplifier circuits are connected to the plural coil elements. In the meantime, the connection relation between the plural amplifier circuits and plural coil elements is not limited to the connection relation illustrated in FIG. 8. Specifically, there may be a case in which the total number of coil elements in the transmitter coil 106 and the total number of channels are equal, or a case in which the total number of channels is less than the total number of coil elements, or a case in which the total number of channels is greater than the total number of coil elements.

The plural amplifier circuits commonly use the drain current that is output from the AC-DC switching power supply 1071 and capacitor bank 1073. When the RF waves are transmitted with use of the plural channels, the outputs of large-power pulses from the respective amplifier circuits vary.

The processing circuitry 150 calculates, by the acquisition function 154, the junction temperature and drain voltage in each of the plural amplifier circuits. For example, the processing circuitry 150 calculates the total of voltage drops by synchronizing and adding drop amounts of plural drain voltages corresponding to the plural amplifier circuits.

The processing circuitry 150 judges, by the judgement function 155, the possibility/impossibility of execution of main scan, based on the junction temperature of each of the amplifier circuits, and the total of the voltage drops. Specifically, the processing circuitry 150 reads out the first threshold from the storage circuitry 123, and executes a first comparison of comparing the first threshold and the total of voltage drops. The first threshold in this modification has a value which is obtained by multiplying the first threshold in the first embodiment by the total number of coil elements. In addition, the processing circuitry 150 reads out the second threshold from the storage circuitry 123, and executes a second comparison of comparing the second threshold and the junction temperature of each of the amplifier circuits.

When the total of the voltage drops is not greater than the first threshold, or when the junction temperature of at least one of the amplifier circuits is not less than the second threshold, the processing circuitry 150 judges that the imaging conditions in the imaging sequence need to be changed. In the meantime, in the first comparison and second comparison which are executed along a time sequence, if the junction temperature becomes not less than the second threshold before the total of voltage drops becomes not greater than the first threshold, the processing circuitry 150 may specify an amplifier circuit corresponding to a junction temperature which is not less than the second threshold and deviates most from the second threshold. At this time, in the repetitive process of the operation in this modification, the processing circuitry 150 recalculates the junction temperature with respect to the specified amplifier circuit by using re-set imaging conditions.

Additionally, the processing circuitry 150 may compare each of the drain voltages corresponding to the plural amplifier circuits with the first threshold. At this time, the first threshold in the present modification corresponds to the first threshold in the first embodiment. Incidentally, the processing circuitry 150 may specify an amplifier circuit corresponding to the lowest drain voltage among the plural drain voltages which are not greater than the first threshold. At this time, in the repetitive process of the operation in this modification, the processing circuitry 150 recalculates the drain voltage with respect to the specified amplifier circuit by using re-set imaging conditions.

When it was judged that the imaging conditions in the imaging sequence need to be changed, the processing circuitry 150 changes the imaging conditions, based on the junction temperature, among the junction temperatures corresponding to the respective amplifier circuits, which is not less than the second threshold and deviates most from the second threshold, and the total of voltage drops which are not greater than the first threshold. In the meantime, the processing circuitry 150 may change the imaging conditions, based on a drain voltage which is not greater than the first threshold and deviates most from the first threshold, and a junction temperature which is not less than the second threshold and deviates most from the second threshold, among the junction temperatures and drain voltages corresponding to the respective amplifier circuits.

According to the above-described configuration, the following advantageous effects can be obtained.

According to the magnetic resonance imaging apparatus 100 of the present modification, the possibility/impossibility of execution of main scan can be judged based on the junction temperature acquired in each of the plural amplifier circuits and the total of voltage drops, in the transmitter 107 which can transmit RF waves by the plural channels. In addition, according to the magnetic resonance imaging apparatus 100 of the present modification, it is also possible to specify the amplifier circuit of the severest condition, and to judge the possibility/impossibility of execution of main scan. Thereby, according to the present embodiment, the amplifier circuit for each of the channels can be used with a high load, and the risk of damage to the amplifier circuits or system-down can be eliminated when the amplifier circuits are used under the pulse condition with low efficiency.

Second Modification

A second modification of the first embodiment differs from the first embodiment and the first modification in that, based on the power efficiency in the amplifier 1075, the drain voltage and the imaging conditions of the main scan which were determined by the operation of the first embodiment, a power efficiency relating to an imaging sequence using the imaging conditions of main scan is calculated, and the imaging conditions are changed based on the power efficiency relating to the imaging sequence.

The storage circuitry 123 stores the imaging conditions of the main scan. When the amplifier 1075 includes a plurality of amplifier circuits as in the first modification, the storage circuitry 123 stores the power efficiency of each of the FETs in the plural amplifier circuits. The storage circuitry 123 stores a program for calculating the power efficiency relating to the imaging sequence. The power efficiency relating to the imaging sequence is, for example, an average value of the ratio of the output power to the input power over the execution period (imaging period) of the imaging sequence using the imaging conditions of the main scan. The storage circuitry 123 stores a third threshold for judging whether the imaging conditions of the main scan are changeable or not.

The processing circuitry 150 executes the above-described program by the acquisition function 154, based on the power efficiency in the amplifier 1075, the drain voltage and the imaging conditions of the main scan, thereby calculating the power efficiency relating to the imaging sequence. Specifically, the processing circuitry 150 calculates the power efficiency relating to the imaging sequence, by a predetermined calculation using the main scan imaging conditions, RF level and the imaging sequence relating to the main scan. A process relating to the calculation of the power efficiency relating to the imaging sequence is executed, for example, after the process of step Sa7 in FIG. 5. The processing circuitry 150 compares the sequence efficiency and the third threshold by the judgement function 155. When the sequence efficiency is less than the third threshold, the processing circuitry 150 judges that the imaging conditions of the main scan are changeable. When the power efficiency relating to the imaging sequence is less than the third threshold, the processing circuitry 150 changes, by the imaging condition-changing function 156, the imaging condition of the main scan, based on the power efficiency relating to the imaging sequence. For example, the processing circuitry 150 changes the imaging conditions of the main scan so as to increase the power value of the input power.

The display circuitry 125 further displays the judgement result by the judgement function 155, the power efficiency relating to the imaging sequence, and the third threshold. In the meantime, the display circuitry 125 may update and display the drain voltage and junction temperature, which were recalculated in accordance with the change of the imaging conditions.

According to the above-described configuration, the following advantageous effects can be obtained.

According to the magnetic resonance imaging apparatus 100 of the present modification, the power efficiency relating to the imaging sequence is calculated based on the power efficiency of the amplifier 1075, the drain voltage and the main scan imaging conditions, and the imaging conditions can be changed based on the power efficiency relating to the imaging sequence. Thereby, according to the magnetic resonance imaging apparatus 100 of the present modification, the power efficiency at a time when the imaging sequence of the main scan is executed can be enhanced, and the amplifier can be used more efficiently.

Third Modification

A third modification of the first embodiment differs from the first and second modifications in that the imaging conditions are automatically set based on a first difference value between the drain voltage and the first threshold, and a second difference value between the junction temperature and the second threshold.

The storage circuitry 123 stores a first correspondency table which indicates the correspondency of change amounts of parameter values of imaging parameters to the first difference value. The storage circuitry 123 stores a second correspondency table which indicates the correspondency of change amounts of parameter values of imaging parameters to the second difference value. The change amounts of parameter values are, for example, an angle by which the flip angle is decreased, a time width by which TR is increased, and a number by which the number of slices is decreased.

The processing circuitry 150, which realizes the imaging condition-changing function 156, determines the imaging conditions, based on the first difference value and the first correspondency table, when the drain voltage is not greater than the first threshold. The processing circuitry 150 determines the imaging conditions, based on the second difference value and the second correspondency table, when the junction temperature is not less than the second threshold. In the meantime, the processing circuitry 150 may determine the imaging conditions, based on the difference between the drain voltage or the junction temperature, which reaches the threshold earlier, and the threshold.

According to the above-described configuration, the following advantageous effects can be obtained.

According to the magnetic resonance imaging apparatus 100 of the present modification, the imaging conditions can automatically be set based on the first difference value between the drain voltage and the first threshold, and the second difference value between the junction temperature and the second threshold. Thereby, according to the magnetic resonance imaging apparatus 100 of the present modification, in addition to the advantageous effects of the present embodiment, the load on the operator can be reduced, and the examination efficiency can be enhanced.

Second Embodiment

A second embodiment differs from the first embodiment in that, while measurement prescan for executing a part of the imaging sequence relating to the main scan is being executed, a drain voltage is acquired by using a division voltage in voltage division circuitry with which the capacitor bank 1073 is provided, and a junction temperature is acquired by using an armor temperature of the armor of the amplifier 1075.

Figure 9:
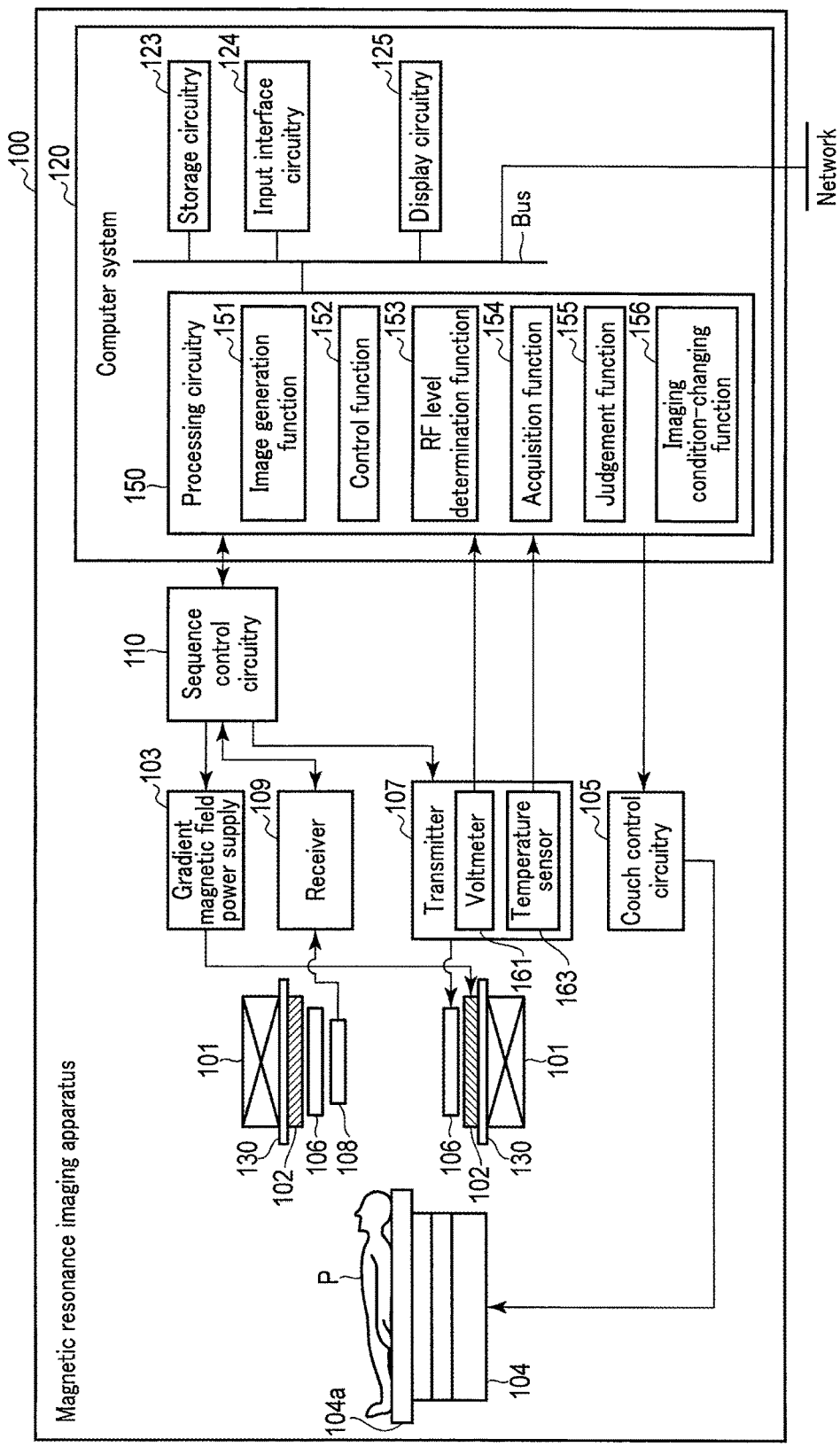
FIG. 9 relates to a second embodiment, and is a block diagram illustrating an example of the configuration of a magnetic resonance imaging apparatus.
Figure 10:
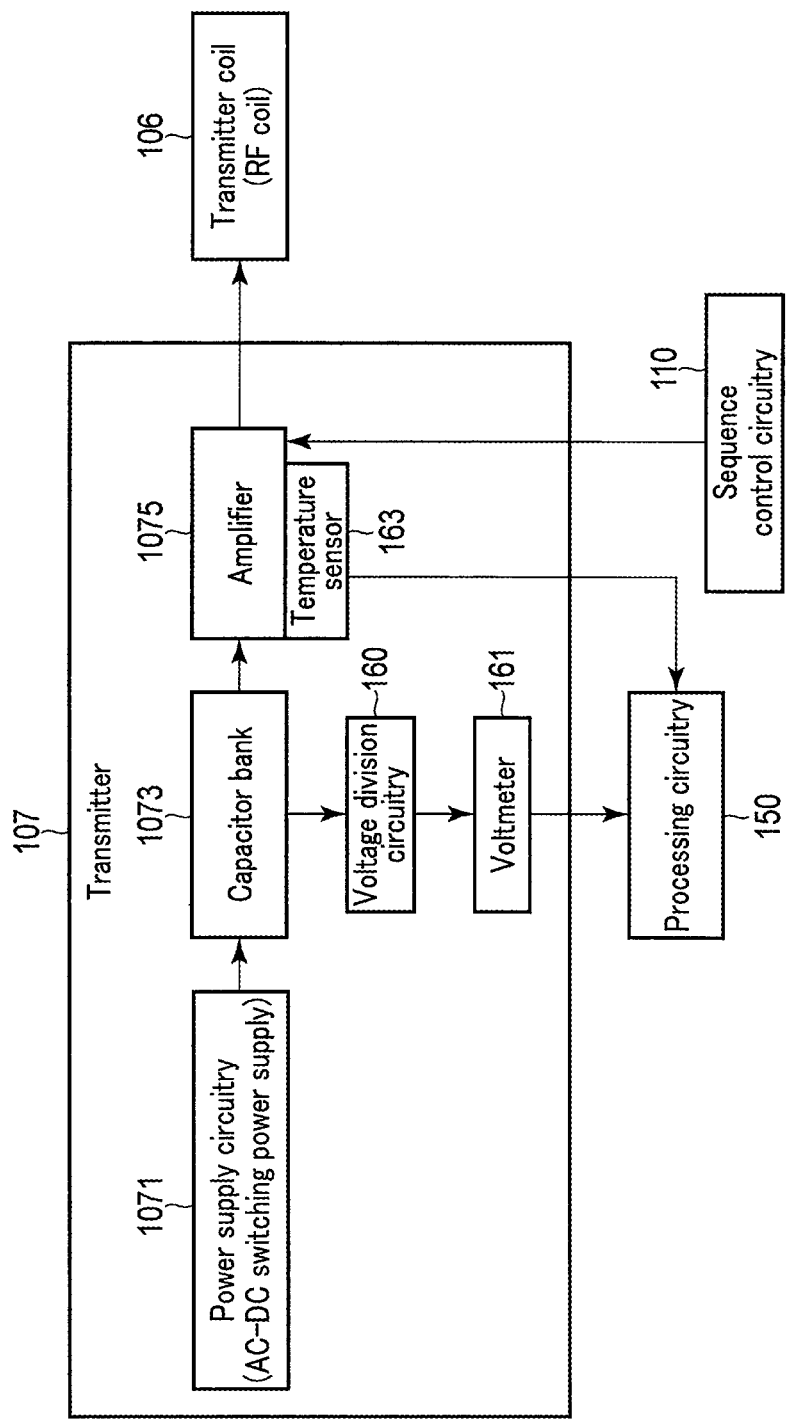
FIG. 10 is a view illustrating an example of the internal configuration of a transmitter according to the second embodiment.
Figure 11:
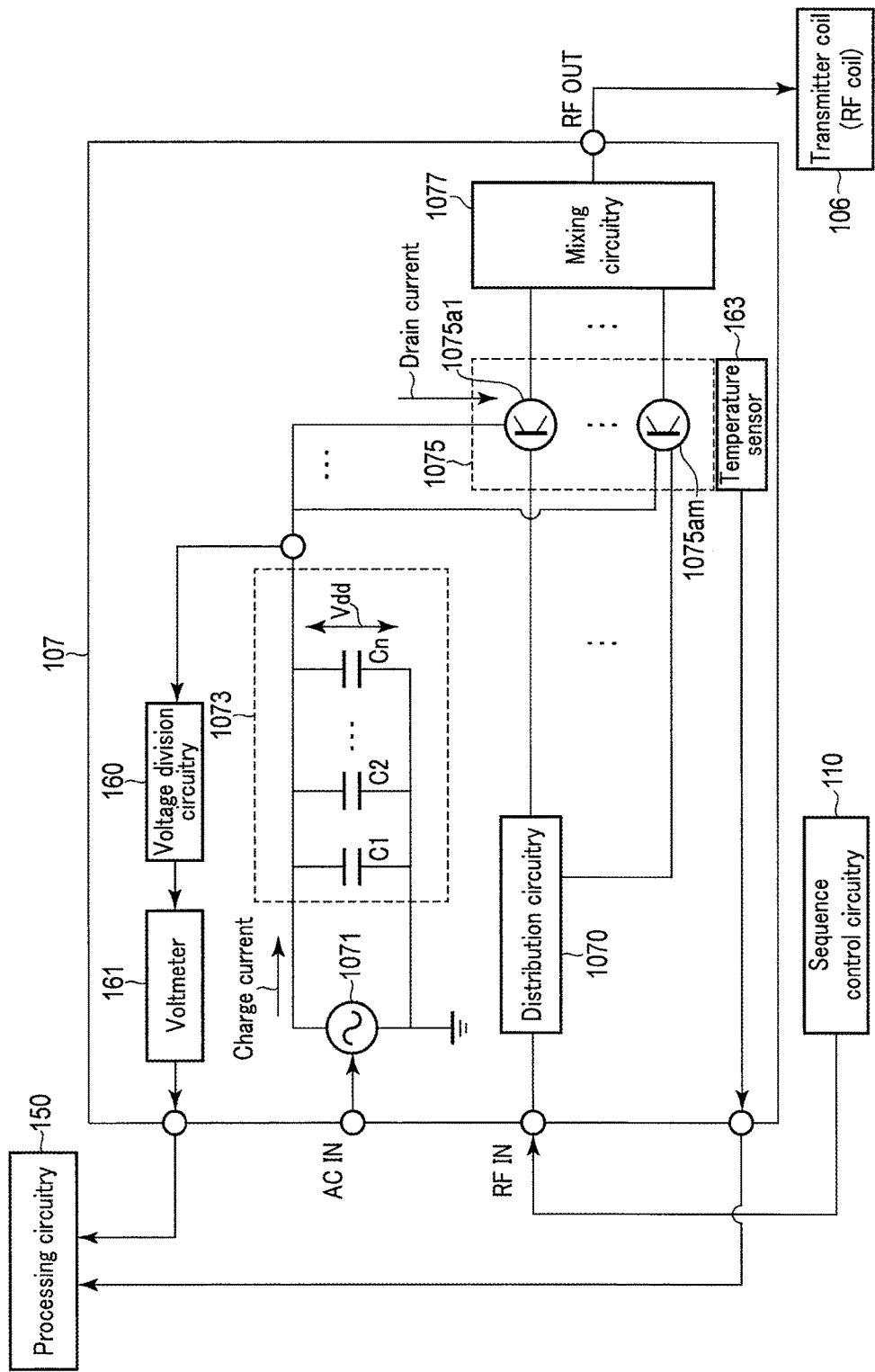
FIG. 11 relates to the second embodiment, and is a view illustrating an example of the circuitry configuration in the transmitter.

FIG. 9 is a view illustrating an example of the configuration of a magnetic resonance imaging apparatus 100 according to the present embodiment. FIG. 10 is a view illustrating an example of the internal configuration of a transmitter 107. FIG. 11 is a view illustrating an example of the circuitry configuration in the transmitter 107. As illustrated in FIG. 9 to FIG. 11, the transmitter 107 further includes voltage division circuitry 160, a voltmeter 161, and a temperature sensor 163.

The sequence control circuitry 110 controls the transmitter 107 so as to execute measurement prescan, following the prescan for determining the RF level. The measurement prescan is scan for executing a part of the imaging sequence relating to the main scan. The sequence control circuitry 110 executes the measurement prescan until both the division voltage and the armor temperature become substantially constant.

The voltage division circuitry 160 lowers the voltage of the capacitor bank 1073 to a voltage which can be measured by the voltmeter 161. The voltmeter 161 measures the division voltage that was lowered by the voltage division circuitry 161.

The storage circuitry 123 stores a voltage conversion formula for calculating a drain voltage by conversion with use of a division voltage.

The temperature sensor 163 is provided on the armor of the amplifier 1075. The temperature sensor 163 measures the armor temperature of the armor of the amplifier 1075. The temperature of the armor corresponds to the ambient temperature in the first embodiment. The temperature sensor 163 includes, for example, a thermocouple for directly measuring the armor temperature, and a processor for converting an output from the thermocouple to temperature data by using a correspondency table for converting an electromotive force by the thermocouple to a temperature. The temperature sensor 163 outputs the temperature data as the armor temperature to the processing circuitry 150. In the meantime, the position of disposition of the temperature sensor 163 in the transmitter 107 is not limited to a position on the armor of the amplifier 1075, and may be any position in the vicinity of the amplifier 1075. At this time, the temperature sensor 163 is composed of, for example, an infrared radiation thermometer which indirectly measures the armor temperature. In addition, the temperature sensor 163 may be composed of an amperemeter for measuring a consumption current by the FET in the amplifier 1075, and a processor for converting an output from the amperemeter to temperature data by using a correspondency table for converting the consumption current to a temperature.

The processing circuitry 150 acquires, by the acquisition function 154, the drain voltage, based on the division voltage measured in the execution of a part of the imaging sequence by the measurement prescan. Specifically, the processing circuitry 150 converts the division voltage to the drain voltage by using the voltage conversion formula. The processing circuitry 150 calculates the junction temperature by using the heat resistance, power loss, armor temperature and temperature calculation formula.

Based on the converted drain voltage, the processing circuitry 150 updates the discharge calculation formula, charge calculation formula, discharge LUT and charge LUT. In addition, the processing circuitry 150 updates the temperature calculation formula and temperature LUT, based on the armor temperature and the converted drain voltage. The processing circuitry 150 causes the storage circuitry 123 to store the updated various calculation formulae and various LUTs. At this time, the processing circuitry 150 determines the drain voltage and junction temperature by using the updated various calculation formulae or various LUTs, in the repetitive process of the operation according to this embodiment. When both the division voltage and the armor temperature have become substantially constant, the processing circuitry 150 controls the sequence control circuitry 110 so as to finish the measurement prescan.

(Operation)

Figure 13:
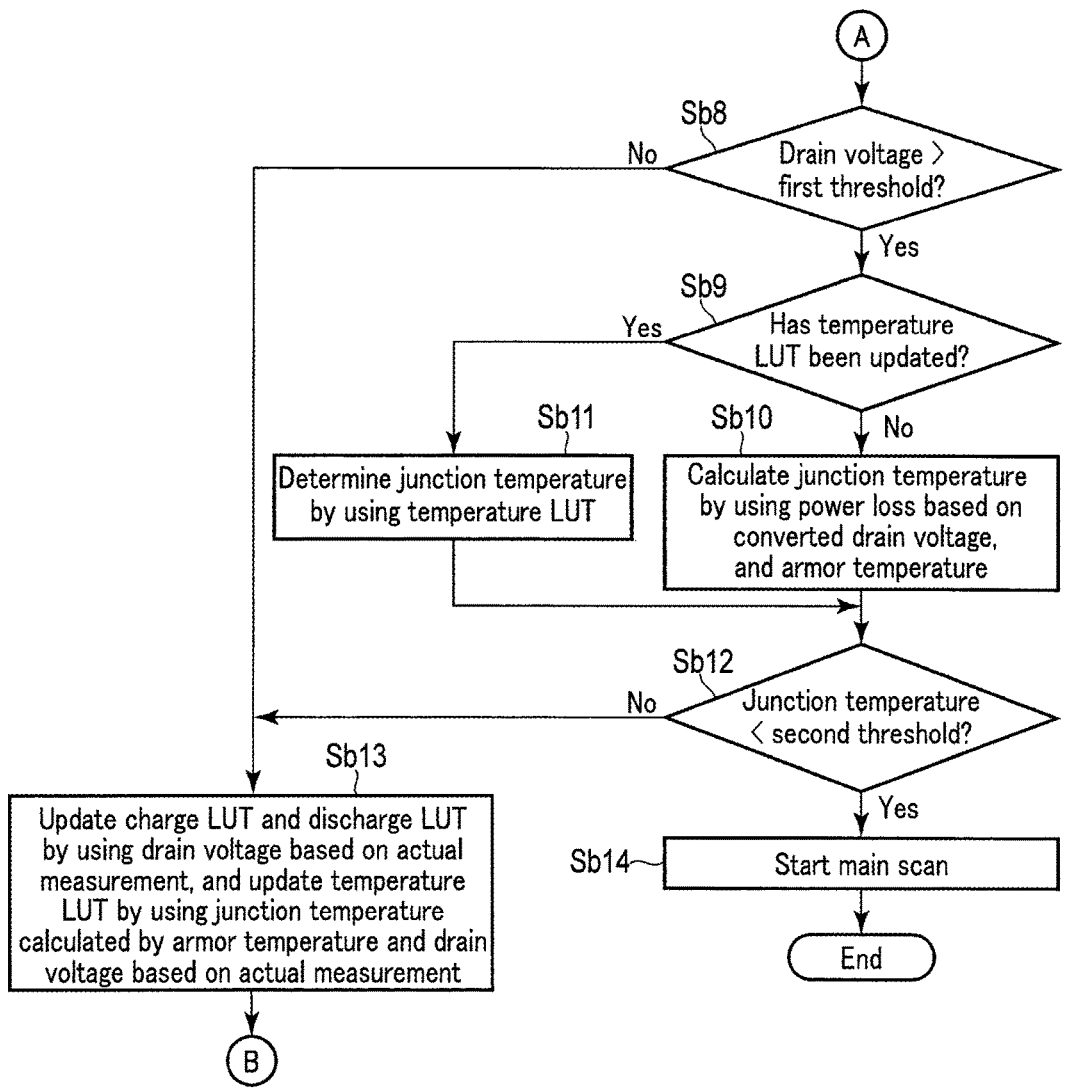
FIG. 13 is a view illustrating an example of the process flow of the operation according to the second embodiment.

The second embodiment differs from the first embodiment in that the drain voltage is calculated by using the division voltage acquired in the measurement prescan, and the junction temperature is calculated by using the armor temperature acquired in the measurement prescan. FIG. 12 and FIG. 13 are views illustrating an example of a process flow of an operation according to the present embodiment. Since the processes of step Sb4, step Sb8, step Sb12 and step Sb14 are the same as those of step Sa3, step Sa5, step Sa7 and step Sa8 in FIG. 5, a description thereof is omitted here.

After the RF level was determined by prescan, measurement prescan is executed (step Sb1). During the execution of the measurement prescan, the division voltage and armor temperature are successively measured (step Sb2). At a time point when both the division voltage and the armor temperature have become substantially constant, the measurement prescan is finished (step Sb3). If the charge LUT and discharge LUT have not been updated (No in step Sb5), the division voltage is converted to the drain voltage by using the voltage conversion formula (step Sb6). If the charge LUT and discharge LUT have been updated (Yes in step Sb5), the drain voltage is determined by using the charge LUT and discharge LUT (step Sb7). If the drain voltage is greater than the first threshold (Yes in step Sb5) and if the temperature LUT has not been updated (No in step Sb9), the junction temperature is calculated by using the power loss of the amplifier 1075, which is based on the converted drain voltage, and the armor temperature (step Sb10). If the drain voltage is greater than the first threshold (Yes in step Sb5) and if the temperature LUT has been updated (Yes in step Sb9), the junction temperature is determined by using the temperature LUT (step Sb11).

If the drain voltage is not greater than the first threshold (No in step Sb8), or if the junction temperature is not less than the second threshold (No in step Sb12), the charge LUT and discharge LUT are updated by using the drain voltage based on actual measurement, and the temperature LUT is updated by using the junction temperature calculated by the armor temperature and the drain voltage based on the actual measurement (step Sb13). After the process of step Sb13, the process of step Sb4, step Sb7, step Sb8, step Sb11 and step Sb12 is repeated. If the junction temperature is less than the second threshold (Yes in step Sb12), the process of step Sb14 is executed. In the above-described series of processes, the various LUTs were used. However, the various calculation formulae may be used in place of the LUTs. In addition, the order of the process of step Sb5 to step Sb8 and the process of step Sb9 to step Sb12 may be reversed.

According to the above-described configuration, the following advantageous effects can be obtained.

According to the magnetic resonance imaging apparatus 100 of the present embodiment, when the drain voltage based on the actually measured division voltage is not greater than the first threshold, or if the junction temperature based on the actually measured armor temperature is not less than the second threshold, the imaging conditions can be changed. In addition, according to this magnetic resonance imaging apparatus 100, the charge LUT and discharge LUT, or the discharge calculation formula or charge calculation formula, can be updated by using the drain voltage based on actual measurement. Furthermore, according to this magnetic resonance imaging apparatus 100, the temperature LUT or temperature calculation formula can be updated by using the drain voltage and armor temperature, which are based on actual measurement. Thereby, according to this magnetic resonance imaging apparatus 100, the voltage drop amount of the capacitor bank and the load of the amplifier 1075 can precisely be calculated by using the optimal various LUTs and various calculation formulae, which reflect actual measurement values. From the above, according to this embodiment, the amplifier 1075 can be used with a higher load, and the possibility of the risk of damage to the amplifier 1075 or system-down can be further decreased when the amplifier 1075 is used under the pulse condition with low efficiency.

According to the magnetic resonance imaging apparatuses 100 of the above-described embodiments and at least one modification, it is possible to use the amplifier 1075 with a high load, and to prevent damage to the amplifier 1075 or system-down at the time of use with low efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus, comprising:
an amplifier configured to supply, based on an imaging sequence, an RF pulse to an RF coil, which generates a radio frequency magnetic field;
a capacitor bank configured to supply an electric power to the amplifier; and
processing circuitry configured to judge whether an imaging by the imaging sequence is able to be executed, based on a condition of the RF pulse in the imaging sequence and an output efficiency of the amplifier,
wherein the processing circuitry is further configured to
calculate a voltage drop in the capacitor bank, based on the condition of the RF pulse and the output efficiency of the amplifier, and judge whether the imaging is able to be executed, based on the voltage drop; and
calculate a heat loss amount in the amplifier, based on the output efficiency, and judge whether the imaging is able to be executed, based on the heat loss amount and the voltage drop.

2. The magnetic resonance imaging apparatus according to claim 1, wherein the condition of the pulse includes (a) an amplitude corresponding to a power of the RF pulse, and (b) a waveform of the RF pulse, the waveform being defined by the imaging sequence, and
the processing circuitry is further configured to determine the amplitude, based on a radio frequency magnetic field which is transmitted/received to/from a subject via the RF coil.

3. The magnetic resonance imaging apparatus according to claim 1, wherein the processing circuitry is further configured to calculate the voltage drop, based on a charge/discharge characteristic of the capacitor bank by the imaging sequence.

4. The magnetic resonance imaging apparatus according to claim 1, wherein the processing circuitry is further configured to:
judge that the imaging condition in the imaging sequence needs to be changed, when the voltage drop is not greater than a first threshold or when the heat loss amount is not less than a second threshold, and
change the imaging condition when it is judged that the imaging condition needs to be changed, and
the magnetic resonance imaging apparatus further comprises display circuitry configured to display the imaging condition when it is judged that the imaging condition needs to be changed.

5. The magnetic resonance imaging apparatus according to claim 4, wherein the first threshold and the second threshold are used by the processing circuitry to judge whether the imaging is able to be executed.

6. The magnetic resonance imaging apparatus according to claim 4, wherein the RF coil includes a plurality of coil elements corresponding to a plurality of channels, the amplifier further includes a plurality of amplifier circuits corresponding to the plurality of channels, and
the processing circuitry is further configured to
calculate a corresponding heat loss amount and a corresponding voltage drop in each of the amplifier circuits, and
change the imaging condition, based on a voltage drop that is not greater than the first threshold and deviates most from the first threshold, and a heat loss amount that is not less than the second threshold and deviates most from the second threshold, among the heat loss amounts and the voltage drops corresponding to the respective amplifier circuits.

7. The magnetic resonance imaging apparatus according to claim 4, wherein the RF coil includes a plurality of coil elements corresponding to a plurality of channels,
the amplifier includes a plurality of amplifier circuits corresponding to the plurality of channels, and
the processing circuitry is further configured to
calculate a corresponding heat loss amount in each of the amplifier circuits, and calculate a total of corresponding voltage drops corresponding to the amplifier circuits by synchronizing and adding the corresponding voltage drops;
judge that the imaging condition in the imaging sequence needs to be changed, when the total of the corresponding voltage drops is not greater than a first threshold or when a heat loss amount of the calculated corresponding heat loss amounts is not less than a second threshold, and
change the imaging condition, based on a heat loss amount of the calculated corresponding heat loss amounts that is not less than the second threshold and deviates most from the second threshold, among the corresponding heat loss amounts corresponding to the respective amplifier circuits, and based on the total of the corresponding voltage drops that are not greater than the first threshold.

8. The magnetic resonance imaging apparatus according to claim 4, wherein the processing circuitry is further configured to:
calculate a power efficiency relating to the imaging sequence, based on the output efficiency, the voltage drop and the imaging condition;
judge whether the power efficiency in the imaging sequence is less than a third threshold or not; and
change the imaging condition, based on the power efficiency in the imaging sequence, when the power efficiency in the imaging sequence is less than the third threshold.

9. The magnetic resonance imaging apparatus according to claim 1, further comprising a temperature sensor configured to measure an armor temperature of an armor of the amplifier,
wherein the processing circuitry is further configured to calculate the heat loss amount by using the armor temperature measured in execution of a part of the imaging sequence.

10. A magnetic resonance imaging apparatus, comprising:
an amplifier configured to supply, based on an imagine sequence, an RF pulse to an RF coil which generates a radio frequency magnetic field;
a capacitor bank configured to supply an electric power to the amplifier; and
processing circuitry configured to calculate a voltage drop in the capacitor bank, based on a condition of the RF pulse in the imaging sequence and an output efficiency of the amplifier, and judge whether an imaging by the imaging sequence is able to be executed, based on the voltage drop; and a voltmeter configured to measure a division voltage in voltage division circuitry provided in the capacitor bank, wherein the processing circuitry is further configured to calculate the voltage drop, based on the division voltage measured in execution of a part of the imaging sequence.

* * * * *